(12) United States Patent
Kobayashi et al.

(10) Patent No.: US 11,169,204 B2
(45) Date of Patent: Nov. 9, 2021

(54) TEMPERATURE CONTROL DEVICE, TEMPERATURE CONTROL METHOD, AND INSPECTION APPARATUS

(71) Applicant: TOKYO ELECTRON LIMITED, Tokyo (JP)

(72) Inventors: Masahito Kobayashi, Nirasaki (JP); Shigeru Kasai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 6 days.

(21) Appl. No.: 16/697,486

(22) Filed: Nov. 27, 2019

(65) Prior Publication Data
US 2020/0174066 A1 Jun. 4, 2020

(30) Foreign Application Priority Data

Nov. 29, 2018 (JP) .............................. JP2018-224108
Mar. 25, 2019 (JP) .............................. JP2019-057315

(51) Int. Cl.
*G01R 31/28* (2006.01)

(52) U.S. Cl.
CPC ..... *G01R 31/2877* (2013.01); *G01R 31/2875* (2013.01)

(58) Field of Classification Search
CPC ............ G01R 31/2877; G01R 31/2875; H01L 21/67109; H01L 21/67103; H01L 21/67248
See application file for complete search history.

(56) References Cited

U.S. PATENT DOCUMENTS

| 2002/0008534 A1* | 1/2002 | Yamazaki | .......... G01R 31/2863 324/750.03 |
| 2009/0315414 A1* | 12/2009 | Shikayama | ............ H02K 41/03 310/12.29 |
| 2014/0072015 A1* | 3/2014 | Han | ........................ G01K 7/02 374/179 |
| 2015/0137442 A1* | 5/2015 | Sekiguchi | ......... H01J 37/32724 269/289 R |

(Continued)

FOREIGN PATENT DOCUMENTS

| JP | 10-135315 A | 5/1998 |
| JP | 2002-318602 A | 10/2002 |
| KR | 10-1227153 B1 | 1/2013 |

*Primary Examiner* — Dominic E Hawkins
(74) *Attorney, Agent, or Firm* — Nath, Goldberg & Meyer; Jerald L. Meyer; Tanya E. Harkins

(57) ABSTRACT

A temperature control device for controlling a temperature of an object, the temperature control device includes a heater having a heating source configured to heat the object, a cooler having a cooling source configured to cool the object; and a temperature controller configured to control the heating source and the cooling source. The temperature controller includes a sliding mode controller configured to supply power to the heating source as an operation amount, a cooling mode controller configured to supply power to the cooling source as an operation amount, and a switching controller configured to determine whether an output of the sliding mode controller will be output to the heating source as a first operation amount, or an output of the cooling mode controller will be used as a second operation amount, based on a nonlinear term value of the output of the sliding mode controller.

15 Claims, 29 Drawing Sheets

(56) References Cited

U.S. PATENT DOCUMENTS

2015/0309482 A1\* 10/2015 Iwami .................... G05B 11/42
          700/37
2018/0188101 A1\* 7/2018 Weindl ................ G01F 25/0046
2018/0335472 A1\* 11/2018 Hwang .............. G01R 31/2877

\* cited by examiner $dx/dt = A*x+B*u1$

Sliding mode control
Heat emission disturbance : 150W

Sliding mode control
Heat emission disturbance : 300W

Sliding mode control
Heat emission disturbance : 450W

First embodiment
Heat emission disturbance : 150W

FIG. 20
First embodiment
Heat emission disturbance : 450W
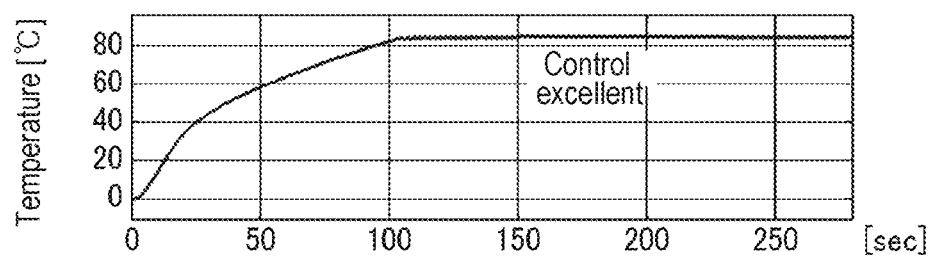
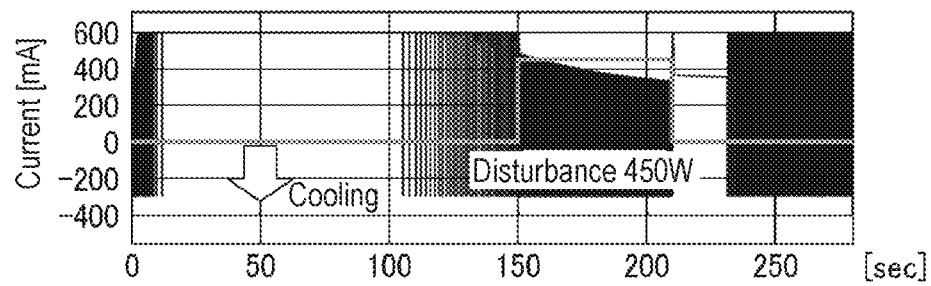

FIG. 21
Second embodiment
Heat emission disturbance : 150W
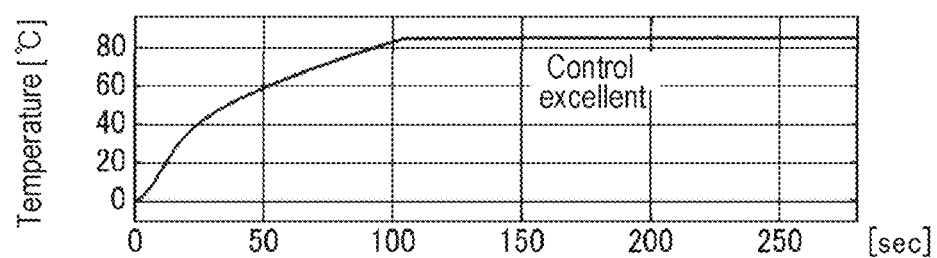
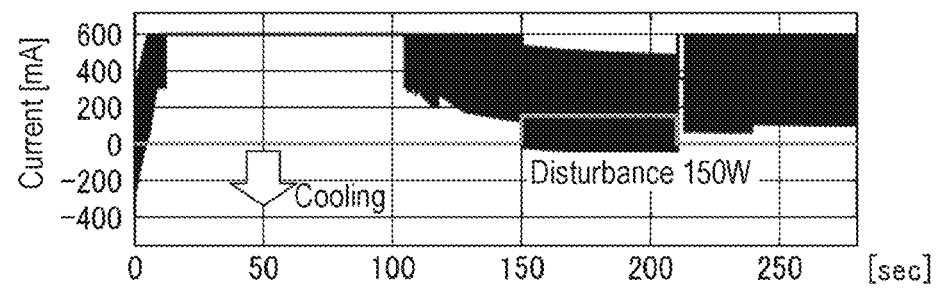

Enlarged view
Second embodiment
Heat emission disturbance : 150W

TEMPERATURE CONTROL DEVICE, TEMPERATURE CONTROL METHOD, AND INSPECTION APPARATUS

CROSS-REFERENCE TO RELATED APPLICATIONS

This application is based upon and claims the benefit of priority from Japanese Patent Application Nos. 2018-224108 and 2019-057315, filed on Nov. 29, 2018 and Mar. 25, 2019, respectively, the entire contents of which are incorporated herein by reference.

TECHNICAL FIELD

The present disclosure relates to a temperature control device, a temperature control method, and an inspection apparatus.

BACKGROUND

In a semiconductor manufacturing process, a plurality of electronic devices having a predetermined circuit pattern are formed on a semiconductor wafer (hereinafter, simply referred to as a wafer). Inspections, for example, of electrical characteristics of the formed electronic devices are performed to classify the electronic devices into normal products and abnormal products. The inspection of an electronic device is performed using an inspection apparatus, for example, in a wafer state before the electronic devices are divided.

The inspection apparatus of the electronic device includes a probe card having a plurality of pin-shaped probes, a stage on which a wafer is placed, and a tester (see patent document 1). This inspection apparatus inspects electrical characteristics of the electronic device by bringing the probes of the probe card into contact with electrode pads or soldering bumps provided to correspond to the electrodes of the electronic device, and by delivering a signal from the electronic device to the tester. Further, the inspection apparatus of patent document 1 has a temperature control device for controlling the temperature of a loader using a refrigerant passage or a heater in the stage to obtain a mounting environment of the electronic device when the electrical characteristics of the electronic device are inspected.

Further, in patent document 2, it is described that a temperature control of a wafer is performed in a sliding mode control using cooling water and a thermoelectric conversion module.

PRIOR TECHNICAL DOCUMENTS

Patent Documents

Japanese Patent Application Publication No. H10-135315
Japanese Patent Application Publication No. 2002-318602

SUMMARY

According to embodiments of the present disclosure, there is provided a temperature control device for controlling a temperature of a temperature control object, the temperature control device including: a heater having a heating source configured to heat the temperature control object; a cooler having a cooling source configured to cool the temperature control object; and a temperature controller configured to control the heating source and the cooling source, wherein the temperature controller uses a temperature measurement value of the temperature control object as a control target, and wherein the temperature controller comprises: a sliding mode controller configured to supply power to the heating source as an operation amount; a cooling mode controller configured to supply power to the cooling source as an operation amount; and a switching controller configured to determine whether an output of the sliding mode controller will be output to the heating source as a first operation amount, or an output of the cooling mode controller will be used as a second operation amount, based on a value of a nonlinear term of the output of the sliding mode controller.

According to embodiments of the present disclosure, there is provided a temperature control device for controlling a temperature of a temperature control object, the temperature control device including: a heater having a heating source configured to heat the temperature control object; a cooler having a cooling source configured to cool the temperature control object; and a temperature controller configured to control the heating source and the cooling source, wherein the temperature controller uses a temperature measurement value of the temperature control object as a control target, and wherein the temperature controller comprises: a sliding mode controller configured to supply power to the heating source as an operation amount; a cooling mode controller configured to supply power to the cooling source as an operation amount; and a switching controller configured to determine whether an output of the sliding mode controller will be output to the heating source as a first operation amount, or a sum of the output of the sliding mode controller and an output of the cooling mode controller will be used as a second operation amount, based on a value of a nonlinear term of the output of the sliding mode controller.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 20 is a view illustrating a simulation result when a heating disturbance is 450 W in the case in which a temperature control of a chip is performed by the control of the first embodiment;

FIG. 21 is a view illustrating a simulation result when a heating disturbance is 150 W in the case in which a temperature control of a chip is performed by the control of the second embodiment;

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

First Embodiment

First, the first embodiment will be described.

Figure 1:
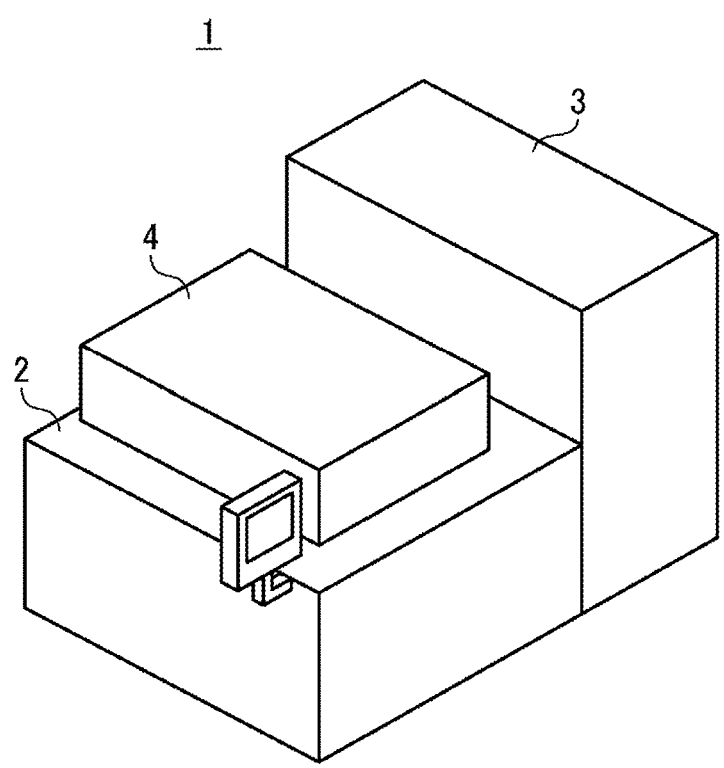
FIG. 1 is a perspective view illustrating a schematic configuration of an inspection apparatus according to a first embodiment.
Figure 2:
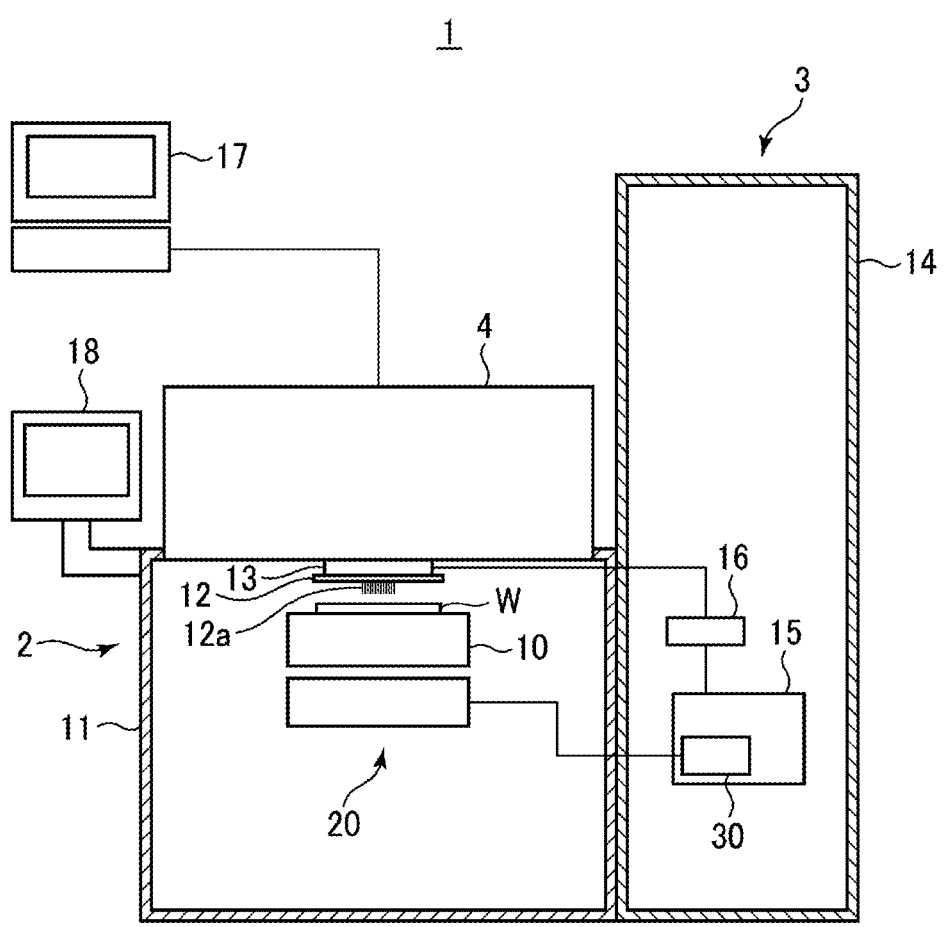
FIG. 2 is a front view illustrating a portion of the inspection apparatus of FIG. 1 in a sectional view.

FIG. 1 is a perspective view illustrating a schematic configuration of an inspection apparatus according to the first embodiment, and FIG. 2 is a front view of the inspection apparatus of FIG. 1 illustrating a portion thereof in a sectional view.

As illustrated in FIGS. 1 and 2, the inspection apparatus 1 is adapted to inspect electrical characteristics of a plurality of electronic devices formed in a wafer W as a substrate that is an inspection object, and includes an inspection part 2, a loader 3, and a tester 4.

The inspection part 2 has a housing 11, the interior of which is hollow, and a stage 10 formed in the housing 11, to which the wafer W to be inspected is suction-fixed. Further, the stage 10 is configured to move in a horizontal direction and a vertical direction by a movement mechanism (not illustrated). A temperature control device 20 that controls the temperature of the stage is provided on the lower side of the stage 10. The temperature control device 20 will be described in detail later.

On the upper side of the stage 10 in the inspection part 2, a probe card 12 is disposed to face the stage 10. The probe card 12 has a plurality of probes 12a that are contacts. Further, the probe card 12 is connected to the tester 4 through an interface 13. When the probes 12a contact the electrodes of the electronic devices of the wafer W, by the probes 12a, electric power is supplied from the tester 4 to the electronic devices through the interface 13, or signals from the electronic devices are delivered to the tester 4 through the interface 13.

The loader 3 has a housing 14, and an FOUP (not illustrated) that is a transfer container, in which the wafer W is accommodated, is disposed in the housing 14. Further, the loader 3 has a transfer mechanism (not illustrated), and takes out the wafer W accommodated in the FOUP and transfers the taken-out wafer W to the stage 10 of the inspection part 2 with a transfer device. Further, the wafer W on the stage 10, the electrical characteristics of which have been inspected, is transferred by the transfer device and is accommodated in the FOUP.

Further, a control part 15 that performs various controls such as a temperature control of the electronic device to be inspected, and a potential difference measuring part 16 that measures a potential difference in potential difference generating circuits (illustration omitted) in the electronic devices are provided within the housing 14 of the loader 3. The potential difference generating circuits are, for example, diodes, transistors, or resistors. The potential difference measuring unit 16 is connected to the interface 13, acquires a potential difference between two probes 12a which contact two electrodes corresponding to the potential difference generating circuits, and delivers the acquired potential difference to the control part 15. A connection structure of wiring lines from the probes 12a and the potential difference measuring unit 16 in the interface 13 will be described later.

The control part 15 has a temperature controller 30 included in the temperature control device 20, and the temperature controller 30 controls the heating mechanism or the cooling mechanism, which will be described later. Further, the control part 15 or the potential difference measuring unit 16 may be provided in the housing 11 of the inspection part 2, and the potential difference measuring unit 16 may be provided in the probe card 12.

A user interface 18 that constitutes a portion of the control part 15 is provided in the housing 11 of the inspection part 2. The user interface 18 is adapted to properly display information to a user or allow the user to input instructions, and for example, may include an input part such as a touch panel or a keyboard and a display part such as a liquid crystal display.

The tester 4 has a test board (illustration omitted) that realizes a portion of a circuit configuration of a mother board, on which the electronic device is mounted. The test board is connected to a tester computer 17 that determines the quality of the electronic device based on a signal from the electronic device. The tester 4 may realize circuit configurations of a plurality of kinds of mother boards by replacing the test board.

Further, the probe card 12, the interface 13, and the tester 4 constitute an inspection mechanism.

When the electrical characteristics of the electronic device are inspected, a tester computer 17 transmits data to the test board connected to the electronic device through the probes 12a. Further, the tester computer 17 determines whether the transmitted data have been precisely processed by the test board, based on the electric signal from the test board.

Figure 3:
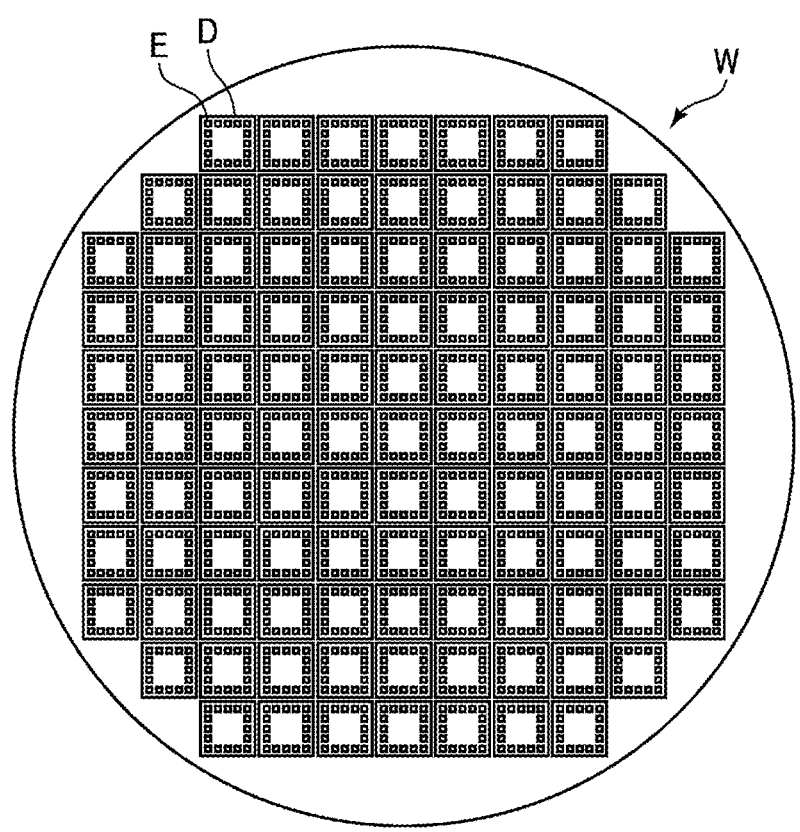
FIG. 3 is a plan view schematically illustrating a configuration of a wafer as a substrate that is an inspection object.

The wafer W as a substrate that is an inspection object, as illustrated in FIG. 3, has a plurality of electronic devices D, which are formed on a surface of a substantially disk-shaped silicon substrate at predetermined intervals by etching or wiring the silicon substrate. Electrodes E are formed on a surface of the electronic device D, and the electrode E is electrically connected to a circuit element in the interior of the electronic device D. By applying voltage to the electrodes E, a current may flow to the circuit elements in the interiors of the electronic devices D.

Figure 4:
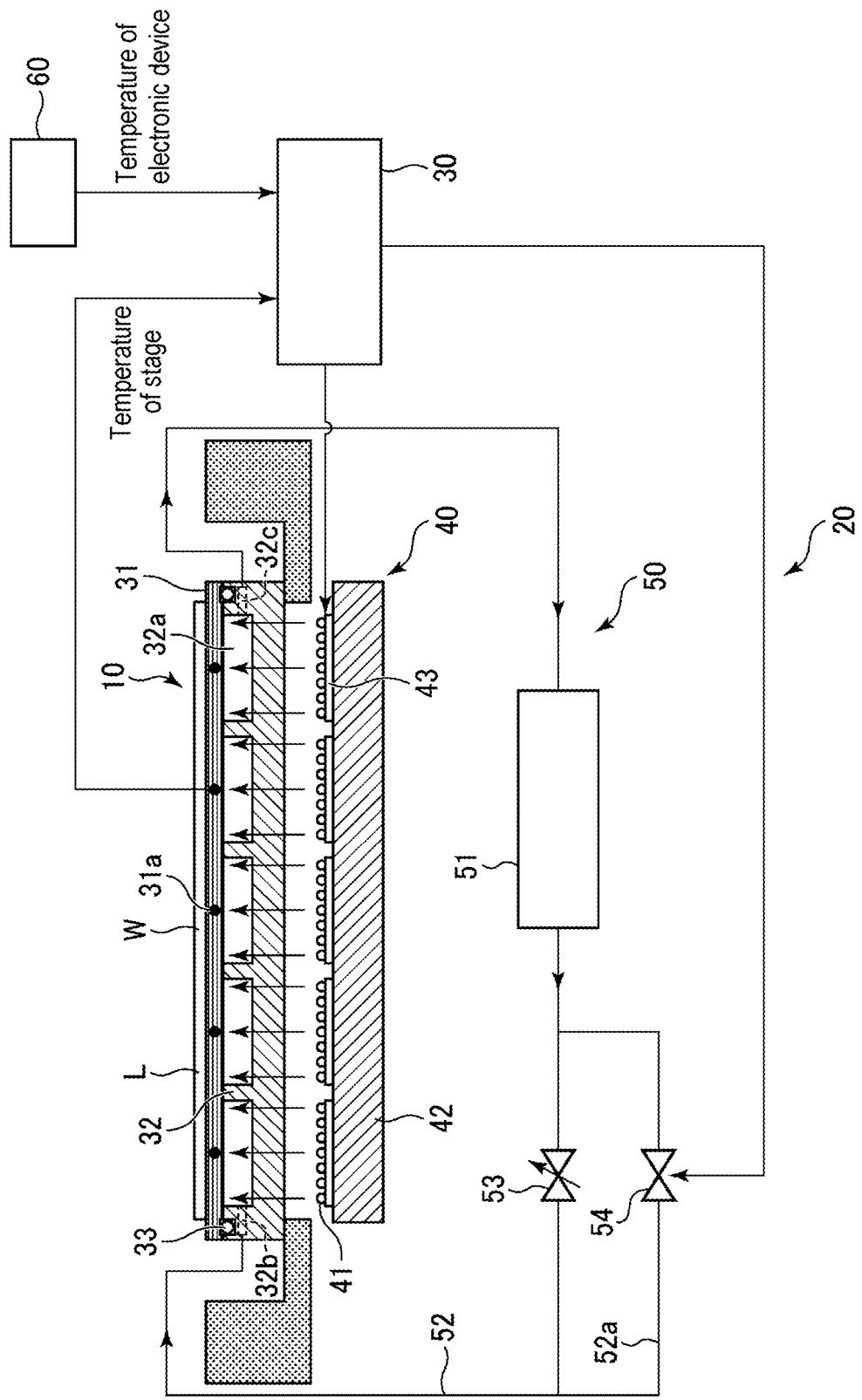
FIG. 4 is a cross-sectional view schematically illustrating an upper configuration of a stage and a temperature control device.

Next, configurations of the stage 10 and the temperature control device 20 will be described with reference to FIG. 4. FIG. 4 is a cross-sectional view schematically illustrating configurations of an upper portion of the stage 10 and a temperature control device 20.

As illustrated in FIG. 4, the stage 10 has a bottomed member 32 thereof, and a cover member 31. The cover member 31 is mounted on the bottomed member 32 via a sealing ring 33. The wafer W is suction-held on the cover member 31.

The cover member 31 has a disk shape, and is formed of, for example, SiC. SiC has a high thermal conductivity and a high Young's modulus. Further, it has a high absorption efficiency of the light from the LED 41 of the heating mechanism 40, which will be described below, so that the cover member 31 can be efficiently heated by the light from the heating mechanism 40. Further, SiC may be formed via sintering after it is formed to a green sheet, and have a small amount of processing.

An absorption hole (illustration omitted) for absorbing the wafer W is formed on an upper surface of the cover member 31. Further, a plurality of temperature sensors 31a are buried in the cover member 31 at locations that are spaced apart from each other when viewed in a plan view.

A bottomed member 32 has a disk-shape of substantially the same diameter as that of the cover member 31, and is formed of a transparent material for the wavelength of the light from the LED, which will be described later. A groove, through which the refrigerant flows, is formed at an upper portion of the bottomed member 32, and the groove is covered by the cover member 31 to define a refrigerant passage 32a. That is, the stage 10 has the refrigerant passage 32a in the interior thereof.

The temperature control device 20 has a heating mechanism 40, a cooling mechanism 50, and a temperature controller 30. The temperature control device 20 performs a control such that the temperature of an electronic device D that is an inspection target formed in the wafer W on the stage 10 is kept constant at a target temperature through heating by the heating mechanism 40 and cooling by the cooling mechanism 50.

The heating mechanism 40 is configured as a light irradiating mechanism, and heats the wafer W and heats the electronic device D formed on the wafer W by irradiating light to the cover member 31 of the stage 10 to heat the cover member 31.

Figure 5:
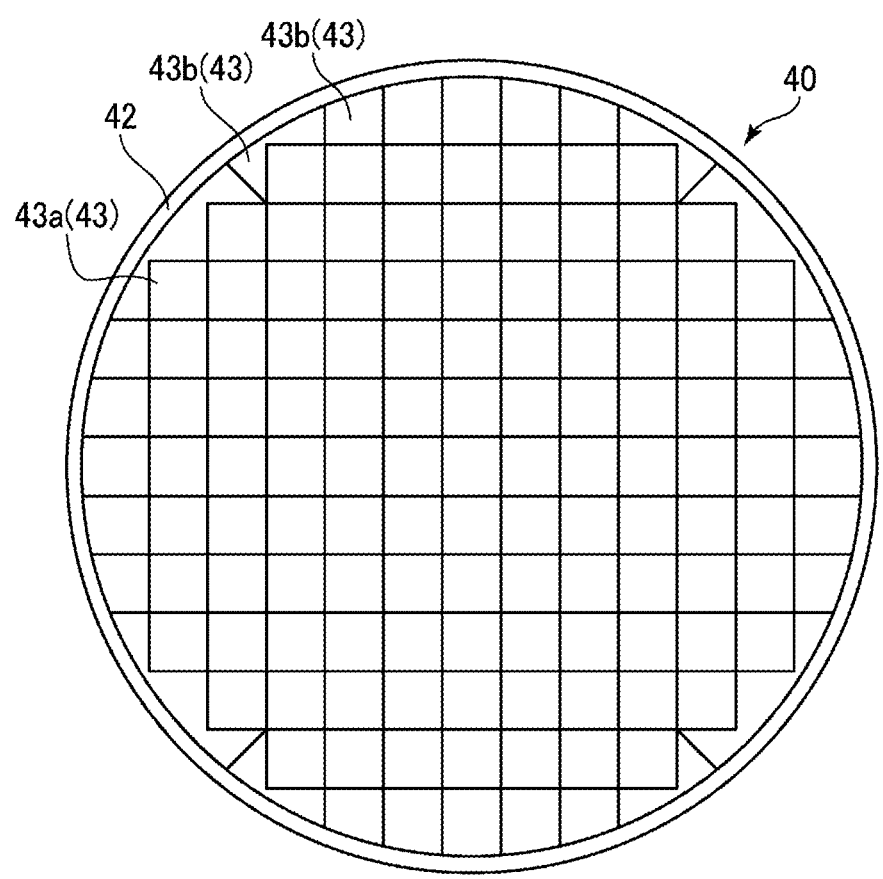
FIG. 5 is a plan view schematically illustrating a configuration of a heating mechanism.

The heating mechanism 40 is disposed to face a surface that is opposite to the loading surface of the wafer W of the stage 10, that is, the lower surface of the bottomed member 32. The heating mechanism 40 has a plurality of LEDs 41 which emits light toward the wafer W as a heating source. In detail, the heating mechanism 40 has a configuration in which a plurality of LED units 43, each of which has plurality of LEDs 41 formed into a unit, is mounted on a surface of a base 42. The LED units 43 in the heating mechanism 40, for example, as illustrated in FIG. 5, has units 43a having square shapes when viewed in a plan view and arranged to correspond to the electronic device D (see FIG. 3), and units 43b having non-square shapes when viewed in a plan view and provided at an outer periphery thereof. The substantially entire surface of the base 42 is covered by the units 43a and 43b, and light may be emitted from the LEDs 41 of the LED units 43 to at least a whole portion of the cover member 31, at which the wafer W is mounted.

The LEDs 41, for example, emit near-infrared light. The light (hereinafter, referred to as 'LED light') emitted from the LEDs 41 penetrates the bottomed member 32 of the stage 10 including a light penetration member. The refrigerant flowing through the refrigerant passage 32a includes a material, which light from the LEDs 41 transmits, and the light that penetrated the bottomed member 32 penetrates the refrigerant flowing through the refrigerant passage 32a and enters the cover member 31. When the light from the LEDs 41 is near-infrared light, polycarbonate, quartz, polyvinyl chloride, an acryl resin, or glass may be used as the light penetration member constituting the bottomed member 32. These materials are easily processed or formed.

In the heating mechanism 40, the LED light input to the cover member 31 of the stage 10, on which the wafer W of the stage 10 is loaded, is controlled using the LED unit 43 as a unit. Accordingly, the heating mechanism 40 may irradiate only an arbitrary number of sites of the cover member 31 with the LED light, or the intensity of the irradiated light may be made different at sites that are different from the arbitrary site.

The cooling mechanism 50 has a chiller unit 51, a refrigerant pipeline 52, a variable flow rate valve 53, and a high-speed valve 54. The chiller unit 51 stores the refrigerant and controls the temperature of the refrigerant to a predetermined temperature. As the refrigerant, for example, water that is a liquid, which the light irradiated from the LEDs 41 can penetrate, is used. The refrigerant pipeline 52 is connected to a supply port 32b and a discharge port 32c provided on a lateral portion of the bottomed member 32, and also is connected to the chiller unit 51. The refrigerant in the chiller unit 51 is supplied to the refrigerant passage 32a through the refrigerant pipeline 52 while circulating, by a pump (not illustrated) provided in the refrigerant pipeline 52. The variable flow rate valve 53 is provided on a downstream side of the chiller unit 51 of the refrigerant pipeline 52, and the high-speed valve 54 is provided in a bypass pipeline 52a which bypasses the variable flow rate valve 53 on the downstream side of the chiller unit 51. The variable flow rate valve 53 may be set in flow rate, and is configured to supply the refrigerant by a predetermined constant amount. Further, the high-speed valve 54 is opened and closed (on/off) at a high speed based on a nonlinear gain term during a sliding control, which will be described below, and may perform supply of the refrigerant flowing through the bypass pipeline 52a and stop of the supply at a high speed.

The temperature controller 30 controls the temperature of the stage such that the temperature of the electronic device D becomes a predetermined temperature by the heating mechanism 40 and the cooling mechanism 50, based on the measurement result of the temperature of the electronic device D.

Figure 6:
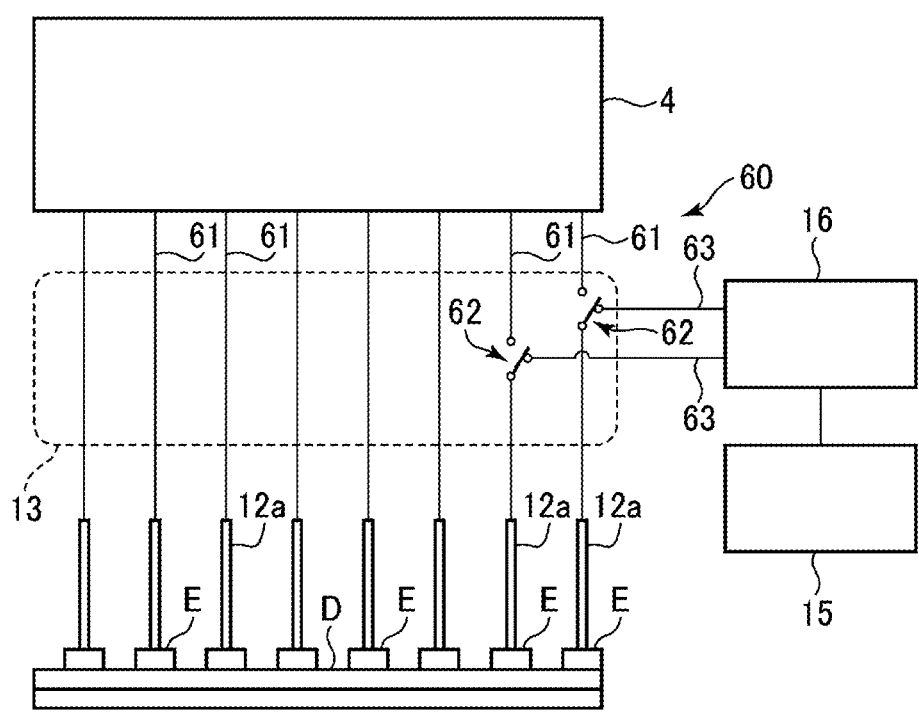
FIG. 6 is a view schematically illustrating a configuration of a temperature measuring circuit of an electronic device.

The temperature of the electronic device D is measured by a temperature measuring circuit 60. FIG. 6 is a view schematically illustrating a configuration of the temperature measuring circuit 60 that measures the temperature of the electronic device D.

As illustrated in FIG. 6, the probes 12a are connected to the tester 4 by a plurality of wiring lines 61 disposed in the interface 13. A relay 62 is provided in each of the two wiring lines 61 connecting the tester 4 with the two probes 12a which contact the two electrodes E of the potential difference generating circuit (for example, a diode) of the electronic device D. Further, the relays 62 may be connected to the wiring lines 63 of the potential difference measuring unit 16.

That is, the relays 62 may switch to deliver the potentials of the electrodes E to any one of the tester 4 and the potential difference measuring unit 16. For example, when the electrical characteristics of the electronic device D are inspected, the potentials of the electrodes E are delivered to the potential difference measuring unit 16 at a predetermined timing after voltage that is applied when the electronic device D is mounted is applied to the electrodes E. It is known that the potential difference generated when a predetermined current flows through the potential difference generating circuit becomes different depending on a temperature. Accordingly, the temperature of the electronic device D may be measured in real time during the inspection, based on the potential difference of the potential difference generating circuit of the electronic device D, that is, the potential difference between the two electrodes E (the probes 12a) of the potential difference generating circuit.

That is, the temperature measuring circuit 60 includes the potential difference generating circuit of the electronic device D, the two probes 12a that contact the two electrodes of the potential difference generating circuit, the two wiring lines 61 connected to the two probes 12a, the relays 62, the wiring lines 63, and the potential difference measuring unit 16.

Further, the method for measuring the temperature of the electronic device D is not limited to the above, but may be another method.

The temperature controller 30 performs a temperature control by a sliding mode control in which power (a current value output) supplied to the LED 41 that is a heating source is an operation amount, and a cooling mode control in which power (that is, an opening/closing signal of the high-speed valve) supplied to the high-speed valve that is a cooling source is an operation amount, based on the temperature measurement result of the above-described electronic device D.

The sliding mode control is a control method of switching a control to above and below the switching hyperplane so as to constrain the state to a preset switching hyperplane (a switching plane) in the state space. When the initial state of the control target is outside the switching hyperplane, the state of the control target is caused to reach and be restricted to the switching hyperplane in a finite time (a reaching mode). If the state of the control target reaches the switching hyperplane, the state converges to a target value while sliding in the switching hyperplane (a sliding mode). The control input u of the sliding mode control is a sum of a linear term (a linear control operation amount) $u_l$ and a nonlinear term (a nonlinear control operation amount) $u_{nl}$, and may be represented by the following equation.

$$u = -(SB)^{-1}SAx - K\,(SB)^{-1} \cdot \text{sgn}\,(\sigma)$$
$$= -(SB)|^{-1}\,\{SAx + K \cdot \text{sgn}\,(\sigma)\}$$
$$\sigma = Sx$$

Figure 7:
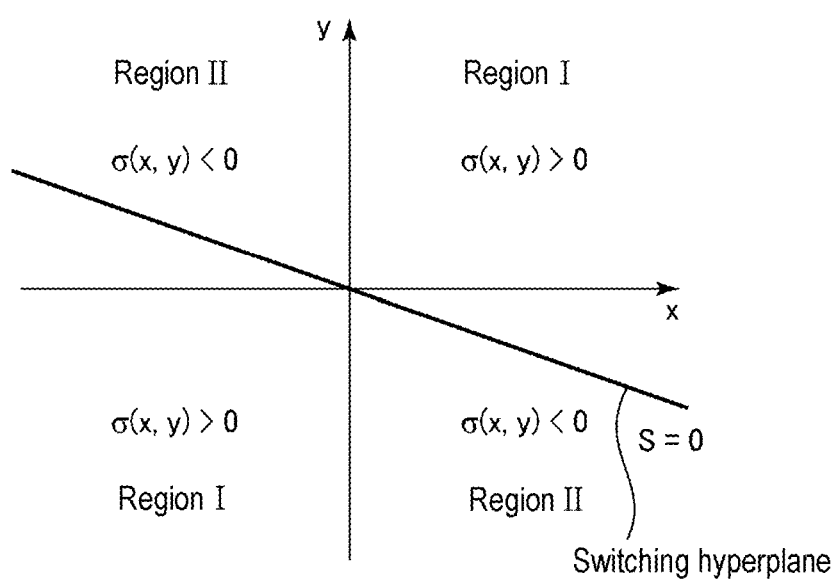
FIG. 7 is a view illustrating a sliding mode control.

SAx is a linear term, and K·sgn(σ) is a nonlinear term. A and B are matrixes of a state equation, and S and K are control parameters. The function sgn represents a discontinuous function, and sgn(σ) is a switching function of the sliding mode. The switching hyperplane may be designed with a framework of a linear control, and in the sliding mode, the control proceeds on the switching hyperplane by the non-linear term while moving back and forth between the region II and the region I shown in FIG. 7 in a very short time. That is, in the sliding mode, the linear term (the linear control operation amount) minimizes a control error of the state of the control system on the switching hyperplane, and the nonlinear term (the nonlinear control operation amount) causes the state of the control system to direct to the switching hyperplane if there is a modeling error or an uncertain disturbance.

Figure 8:
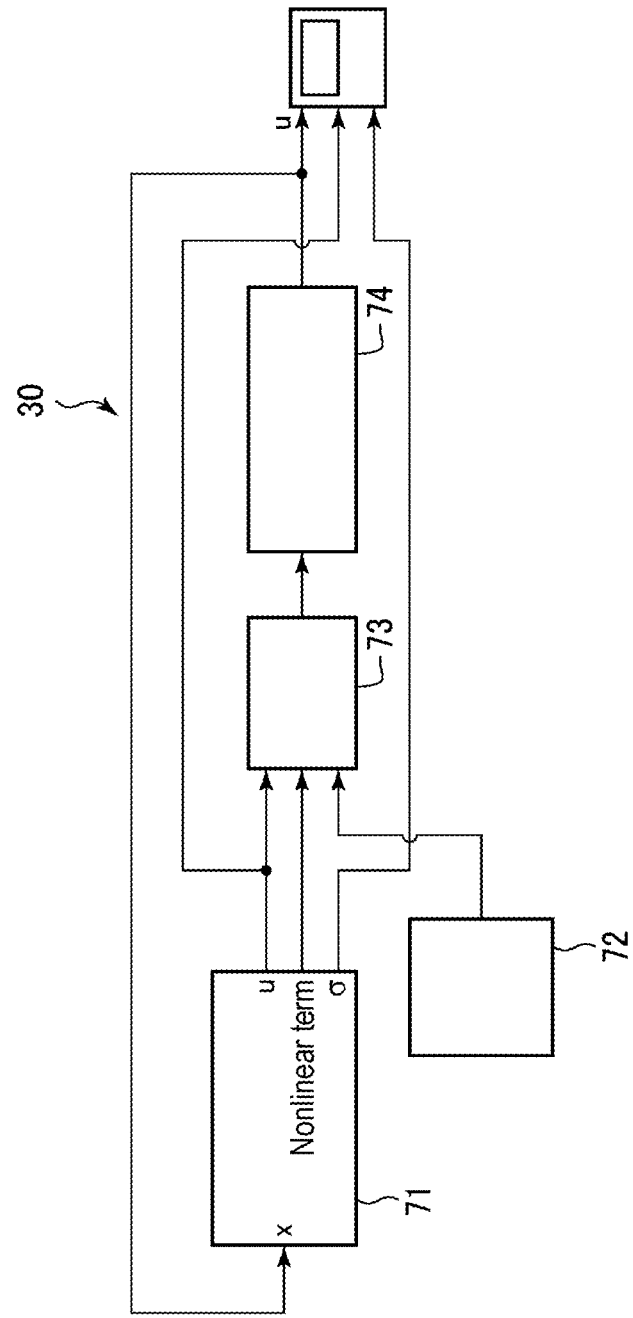
FIG. 8 is a block diagram illustrating a control block of a temperature controller in the inspection apparatus according to the first embodiment.

FIG. 8 is a view illustrating a control block of the temperature controller 30. The temperature controller 30 has a sliding mode controller 71, a cooling mode controller 72, a switching controller 73, and a plant model 74.

Figure 9:
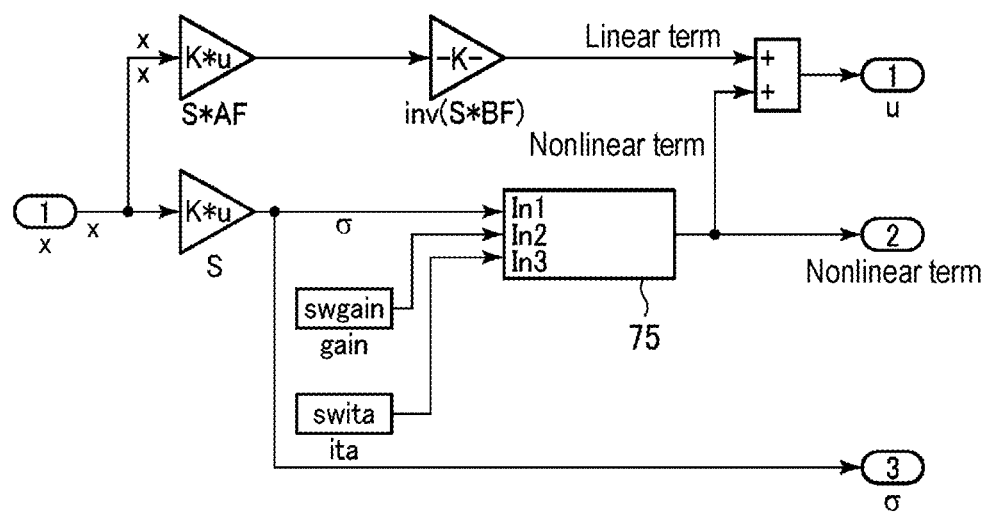
FIG. 9 is a block diagram illustrating the interior of a sliding mode controller in the temperature controller of FIG. 8.
Figure 10:
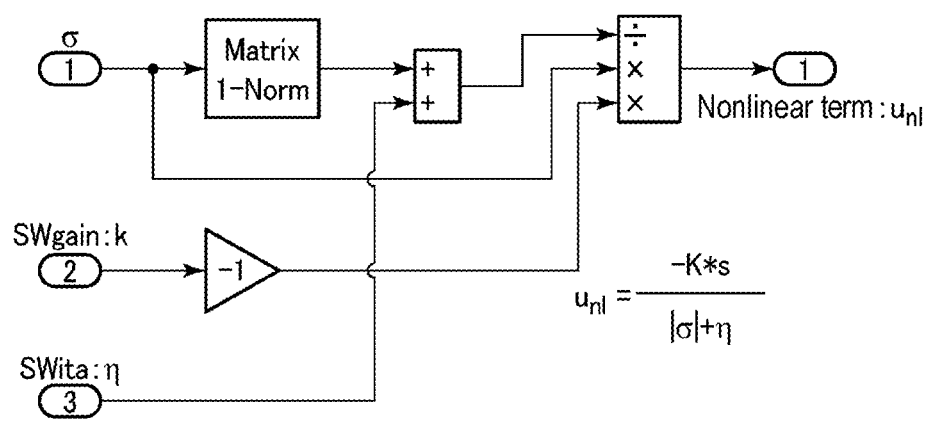
FIG. 10 is a block diagram illustrating a nonlinear input part of the sliding mode controller of FIG. 9.

The sliding mode controller 71 outputs power (an output as a current value) supplied to the LEDs 41 of the heating mechanism 40 as an operation amount, and performs a temperature control. In the sliding mode controller 71, as illustrated in FIG. 9, a temperature detection signal x is input, and a control input u is formed by a linear term (a linear gain term) and a nonlinear term (a nonlinear gain term) generated in a nonlinear input part 75. In the nonlinear input part 75, as illustrated in FIG. 10, a nonlinear input (a nonlinear term): $u_{nl}$ is generated by a switching function σ, SWgain: k, and SWita: η. $u_{nl}$ is represented in the following equation.

$$u_{nl} = -k \cdot \sigma/(|\sigma|+\eta)$$

η is a chattering suppression term. Because the nonlinear input (the nonlinear term): $u_{nl}$ has an infinite switching frequency, the state amount chatters (vibrates at a high frequency) around the switching hyperplane. Accordingly, chattering is restrained by using η to planarize an input.

Figure 11:
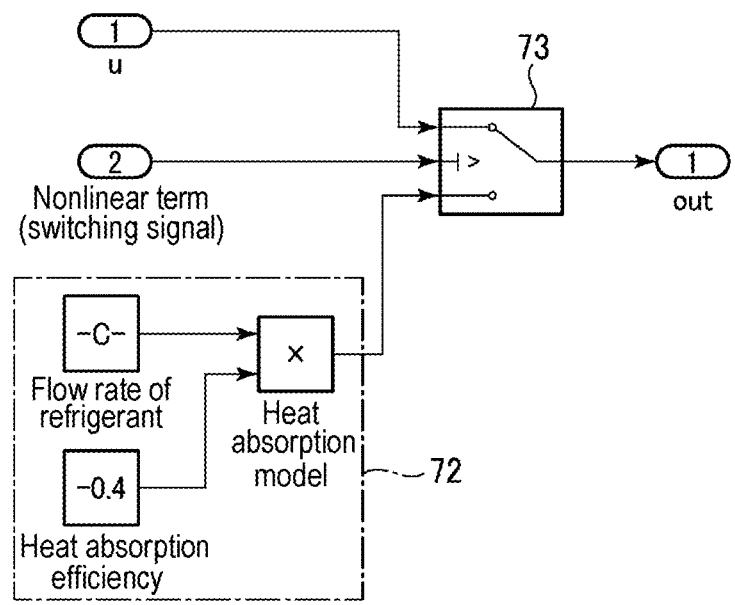
FIG. 11 is a block diagram configurations of a cooling mode controller and a switching controller in the temperature controller of FIG. 8, and signal deliveries thereof.

FIG. 11 is a block diagram illustrating the interiors of the cooling mode controller 72 and the switching controller 73.

The cooling mode controller 72 performs a cooling control using the power (the opening/closing signal of the high-speed valve 54) supplied to the high-speed valve 54 that is a cooling source as an operation amount. By doing this, the amount of the refrigerant supplied to the refrigerant passage 32a of the stage 10 is controlled, and the temperature of the electronic device D is controlled. The output of the cooling mode controller 72 is calculated by a heat absorption model based on the flow rate of the refrigerant and the heat absorption coefficient. In FIG. 11, it is illustrated that the heat absorption coefficient is −0.4, but this is simply an example, and the value changes according to the electronic device D or the like.

The switching controller 73 uses the value of the nonlinear term $u_{nl}$ of the sliding mode controller as a switching signal. That is, the switching controller 73 determines whether the output (the control input) of the sliding mode controller 71 will be used as it is or the output of the cooling mode controller 72 will be used as a second operation amount instead of using the output of the sliding mode controller 71, based on the value of the nonlinear term $u_{nl}$.

Using the output (control input) of the sliding mode controller 71 as it is means that the output of the sliding mode controller 71 is output to the LEDs that are the heating sources as the first operation amount.

Using the output of the cooling mode controller 72 as the second operation amount means that the output of the high-speed valve that is a cooling source of the cooling mode controller 72 is used as the second operation amount.

In detail, when the value of the nonlinear term $u_{nl}$ is positive (one side of the switching hyperplane: region I of FIG. 7), the switching controller 73 outputs the output of the sliding mode controller 71 to the LEDs 41 as the first operation amount. Further, when the value of the nonlinear term $u_{nl}$ is negative (the other side of the switching hyperplane: region II of FIG. 7), the output (the opening/closing signal of the high-speed valve) of the high-speed valve that is a cooling source of the cooling mode controller 72 is used as the second operation amount. The opening/closing time of the high-speed valve is equal to or less than 0.1 sec, and the high-speed valve 54 can be opened and closed following high-speed switching by the nonlinear term $u_{nl}$, and perform a temperature control with a high controllability.

Figure 12:
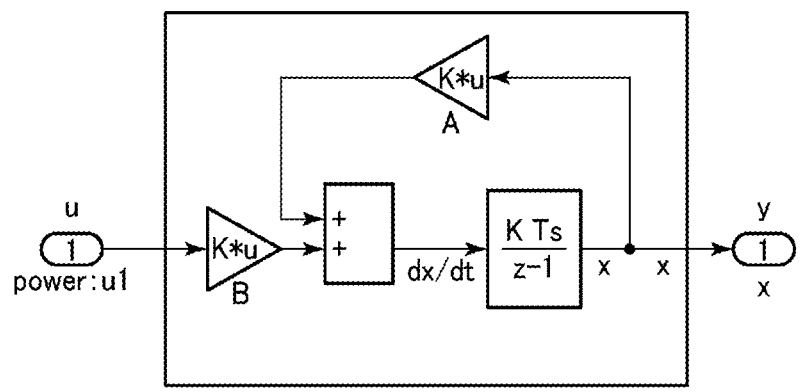
FIG. 12 is a block diagram illustrating the interior of a plant model.

The plant model 74 is a physical model of the electronic device D (the stage 10) that is a temperature control target, and is the same thing as illustrated in FIG. 12. Further, the signal output from the switching controller 73 is input to the plant model 74, and a control signal is obtained via a necessary calculation in the plant model 74.

The temperature control of the electronic device D is performed by the temperature controller 30 while the refrigerant is made to flow to the refrigerant passage 32a at a constant flow rate by the variable flow rate valve 53 of the cooling mechanism 50 to absorb heat. That is, the temperature controller 30 performs temperature controls of a sliding mode control in which power supplied to the LEDs 41 which are heating sources is taken as an operation amount and a cooling mode control in which power (the opening/closing signal of the high-speed valve) supplied to the high-speed valve 54 that is a cooling source is taken as an operation amount. Then, the switching controller 73 determines whether a sliding mode control will be performed by using a nonlinear term $u_{nl}$ as it is or a cooling mode control will be performed by using a nonlinear term $u_{nl}$ as an opening/closing signal of the high-speed valve 54, based on the value of the nonlinear term $u_{nl}$. When the value of the nonlinear term $u_{nl}$ of the sliding mode control is positive, a temperature control of a sliding mode control in which the power supplied to the LEDs 41 is taken as it is as an operation amount is performed. When the value of the nonlinear term $u_{nl}$ of the sliding mode control is negative, the nonlinear term $u_{nl}$ is output as the opening/closing signal of the high-speed valve 54, and the sliding mode control of the LEDs 41 is switched to the cooling mode control. At this time, the output of the sliding mode controller 71 is not used in the temperature control. By using the cooling mode control, the electronic device D may be cooled more greatly than the case in which the LEDs 41 are off. Accordingly, the temperature controllability of the electronic device D when there is a very high heat emission disturbance is secured.

The control part 15 includes a computer, and in addition to the temperature controller 30, has a main control part having a plurality of control function units that control the elements of the inspection apparatus 1, and controls the operations of the elements of the inspection apparatus by the main control part. Further, the control part has an input device, an output device, a display device, and a memory device. The control of the elements by the main control part is performed by a processing recipe that is a control program stored in a recording medium (a hard disk, an optical disk, a semiconductor memory, and the like) embedded in the memory device.

Next, an example of the inspection of the wafer W by using the inspection apparatus 1 will be described.

First, the wafer W is extracted from the FOUP of the loader 3 by a transfer device, is transferred to the stage 10, and is placed. Subsequently, the stage 10 is moved to a predetermined location.

The optical output from the LEDs 41, and the flow rate of the refrigerant flowing through the refrigerant passage 32a in the stage 10 are adjusted by the variable flow rate valve 53 such that the temperature of the cover member 31 has in-plane uniformity based on the information acquired by the temperature sensor 31a of the cover member 31, after turning on all the LEDs 41 of the heating mechanism 40.

In this state, by the potential difference measuring unit 16, the potential difference of the above-described potential difference generating circuit of the electronic device D that is an inspection target is acquired. Further, the potential difference is calibrated on the assumption that the temperature of the cover member 31 which has obtained in-plane uniformity in temperature is coincide with the temperature of the electronic device D that is an inspection target, and the temperature characteristic information of the potential difference is corrected.

Thereafter, the probe 12a provided on the upper side of the stage 10 and the electrode E of the electronic device D that is an inspection target of the wafer W are brought into contact with each other by moving the stage 10. Further, an inspection signal is input to the probe 12a. Accordingly, the inspection of the electronic device D is initiated.

During the inspection, the temperature of the electronic device D is measured based on the information of the potential difference generated in the potential difference generating circuit of the electronic device D that is an inspection target, and a temperature control of the electronic device D is performed by the temperature control device 20 while the measurement temperature is taken as a target temperature.

Then, the temperature control is performed by the temperature controller 30 while the refrigerant is made to flow to the refrigerant flow passage 32a at a constant flow rate by the variable flow rate valve 53 of the cooling mechanism 50 to absorb heat. That is, the temperature controller 30 performs temperature controls of a sliding mode control in which power supplied to the LEDs 41 which are heating sources is taken as an operation amount and a cooling mode control in which power (the opening/closing signal of the high-speed valve) supplied to the high-speed valve 54 that is a cooling source is taken as an operation amount. Then, the switching controller 73, as described above, determines whether the output (the control input) of the sliding mode controller 71 will be used as it is or the cooling mode control will be used by using the nonlinear term $u_{nl}$ as an opening/closing signal of the high-speed valve 54, based on the value of the nonlinear term $u_{nl}$. In detail, when the value of the nonlinear term $u_{nl}$ of the sliding mode control is positive, the output of the sliding mode controller 71 is output to the LEDs 41 as it is as a first operation amount. Meanwhile, when the nonlinear term $u_{nl}$ is negative, the nonlinear term $u_{nl}$ is output to the high-speed valve as a second operation amount while using the nonlinear term $u_{nl}$ as an opening/closing signal of the high-speed valve 54.

The inspection apparatus of patent document 1 performs a temperature control of a stage by using a refrigerant passage or a heater in the stage to realize a mounting environment of the electronic device when the electrical characteristics of the electronic device are inspected.

Meanwhile, in recent years, because the electronic devices have been increased in speed, miniaturization or degree of integration to a high extent, and a heat emission amount during operation rapidly increases, there is a possibility that a heat emission disturbance is given to the wafer during the inspection of the electronic device, causing a problem in the electronic device. However, patent document 1 does not disclose a method of solving such a heat emission disturbance.

Accordingly, in the present embodiment, after heat is absorbed by causing a refrigerant to flow through the refrigerant passage 32a of the stage 10 at a constant flow rate by using the variable flow rate valve 53 of the cooling mechanism 50, a temperature control of the electronic device D is performed while the power (the current value) supplied to the LEDs 41 of the heating mechanism 40 is taken as an operation amount by using the sliding mode control that is robust to a disturbance.

However, when the heat emission disturbance is very severe, heat absorption only using the sliding mode control with a constant flow rate of the refrigerant, in which the power supplied to the LEDs 41 is taken as an operation amount, is not sufficient even though the LEDs 41 are off. For this reason, the response to the disturbance control may become slow, or a sufficient temperature control cannot be achieved. Further, it may be considered to improve heat absorbability by increasing the flow rate of the refrigerant, but in this case, the output of the LEDs 41 becomes insufficient and thus the target temperature cannot be reached. Further, although the rising of the temperature of the electronic device may be restrained by using LEDs having a high maximum output or increasing the density of the LEDs, while increasing the flow rate of the refrigerant, costs increase in this case, which is not practical.

Accordingly, in the present embodiment, a sliding mode control in which the power supplied to the LEDs 41 is taken as an operation amount and the refrigerant is made to flow to the refrigerant passage 32a at a constant flow rate by the variable flow rate valve 53 of the cooling mechanism 50 to absorb heat, and a cooling mode control in which the power (the opening/closing signal of the high-speed valve) supplied to the high-speed valve 54 is taken as an operation amount are performed by being switched by the switching controller 73 based on the value of the nonlinear term $u_{nl}$. That is, when the value of the nonlinear term $u_{nl}$ of the sliding mode control is positive, the influence of the heat emission disturbance is small, and thus the output of the sliding mode controller 71 is output to the LEDs 41 that are heating sources as it is as a first operation amount. Meanwhile, when the value of the nonlinear term $u_{nl}$ is negative, the cooling mode control is performed while the power (the opening/closing signal of the high-speed valve) supplied to the high-speed valve 54 that is a cooling source is taken as a second operation amount. That is, under a circumstance where the sliding mode control is performed, when the heat emission disturbance of the electronic device D is large and the nonlinear term $u_{nl}$ of the sliding mode control is negative, the mode is switched to the cooling mode control by the switching controller 73. Accordingly, the stage 10 may be cooled more greatly than the case in which the LEDs 41 are off, and the cooling capacity is reinforced. Accordingly, even when there is a very high heat emission disturbance, the temperature of the electronic device D can be sufficiently cooled, and the temperature control of the electronic device D may be performed with an excellent controllability. Further, it is preferable that the location of the high-speed valve 54 at this time is as close as possible to the stage 10 from a viewpoint of reducing the dead time as much as possible.

Further, because the plurality of LED units 43, each of which has the plurality of LEDs 41 mounted thereon, are provided to correspond to the plurality of electronic devices D, respectively, the electronic devices D can be heated individually. Accordingly, only the electronic device D under inspection may be heated, and a disturbance of heat emission to the other electronic devices D may be restrained.

Further, because the cooling mode control is performed by using the high-speed valve 54, the high-speed valve 54 may be opened and closed following the positive and negative fluctuations of the nonlinear term $u_{nl}$ used as the switching signal, and the cooling control can be performed with high accuracy.

Further, because water can be used as the refrigerant, it is not necessary to use a Freon-based refrigerant, and because water has a heat absorbability greater than that of the Freon-based refrigerant, heat may be absorbed at a high speed.

Further, the inspection of the electronic device may be performed on a plurality of electronic devices at once, and all the electronic devices may be subjected to the inspection in a lump like collective contact probing employed a DRAM or the like. In any case, the temperature of an electronic device to be inspected, as described above, may be controlled with an excellent controllability by employing both the sliding mode control in which the power of the LEDs 41 is taken as an operation amount and the cooling mode control by the opening and closing of the high-speed valve.

Second Embodiment

Next, the second embodiment will be described.

Figure 13:
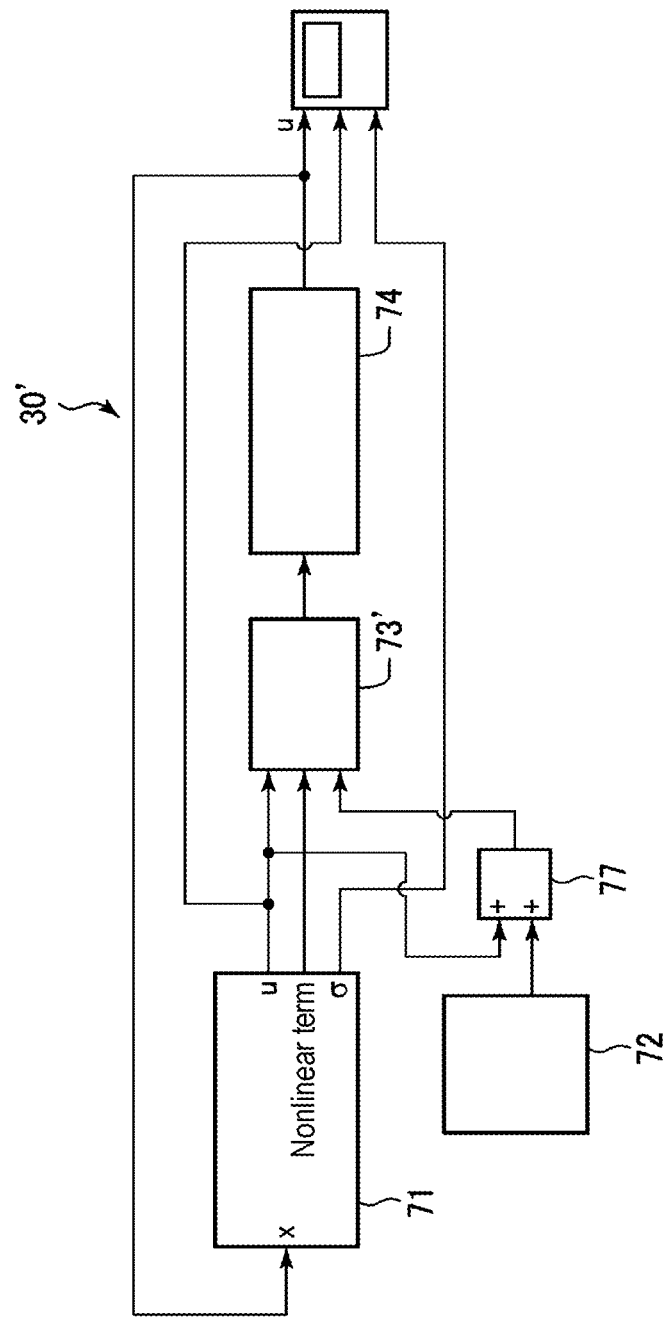
FIG. 13 is a block diagram illustrating a control block of a temperature controller in the inspection apparatus according to a second embodiment.

The basic configuration of the inspection apparatus of the second embodiment is the same as that of the inspection apparatus 1 of the first embodiment, but as illustrated in FIG. 13, which will be described below, the inspection apparatus of the second embodiment is different from the inspection apparatus 1 of the first embodiment only in that a temperature controller 30' employing a different control method is mounted instead of the temperature controller 30 included in the temperature control device 20 of the first embodiment.

Even in the temperature controller 30' of the present embodiment, a control based on the sliding mode control in which the power (the current value output) supplied to the LEDs 41 that are heating sources is taken as the operation amount is performed, based on the temperature measurement result of the electronic device D in the same way as the temperature controller 30 of the first embodiment. Further, in the temperature controller 30', as in the temperature controller 30 of the first embodiment, the cooling mode control in which the power (that is, the opening/closing signal of the high-speed valve) supplied to the high-speed valve is taken as an operation amount is performed in addition to the sliding mode control. Meanwhile, the temperature controller 30' of the present embodiment is different from the temperature controller 30 in that a control signal is also sent to the LEDs 41 that are heating sources during a cooling mode.

Hereinafter, the temperature controller 30' will be described in detail.

FIG. 13 is a view illustrating a control block of the temperature controller 30'. The temperature controller 30' has a sliding mode controller 71, a cooling mode controller 72, an adder 77, a switching controller 73', and a plant model 74. The basic configurations of the sliding mode controller 71, the cooling mode controller 72, and the plant model 74 are the same as those of the temperature controller 30 of the first embodiment.

Figure 14:
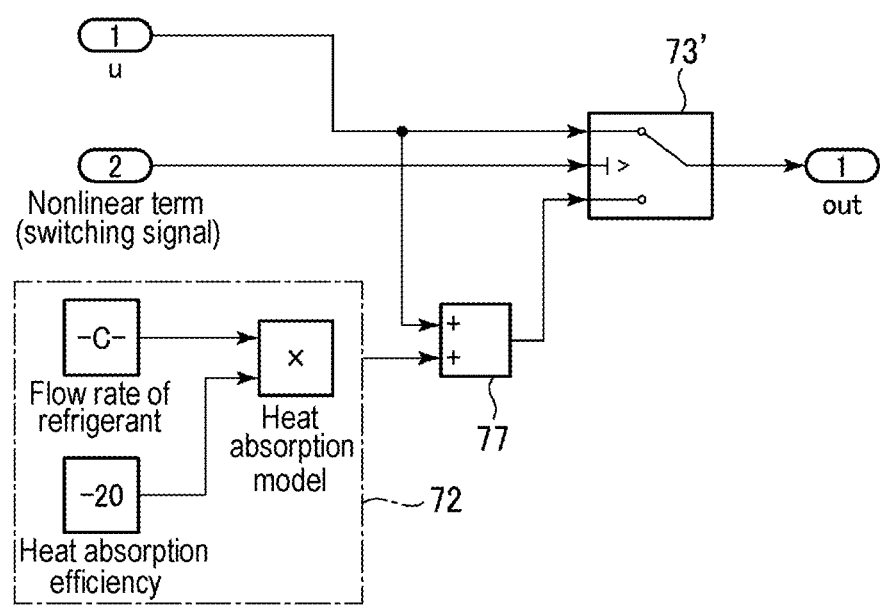
FIG. 14 is a block diagram illustrating the interior of a cooling mode controller and a switching controller in the temperature controller of FIG. 13, and signal deliveries thereof.

FIG. 14 is a block diagram illustrating the configurations of the cooling mode controller 72, the adder 77, and the switching controller 73', and the exchange of the signals therebetween.

As described above, the cooling mode controller 72 performs a cooling control by taking the power (the opening/closing signal of the high-speed valve 54) supplied to the high-speed valve 54 that is a cooling source as an operation amount. Accordingly, the amount of the refrigerant supplied to the refrigerant passage 32a of the stage 10 is controlled, and the temperature of the electronic device D is controlled. The output of the cooling mode controller 72 is calculated by a heat absorption model based on the flow rate and the heat absorption coefficient of the refrigerant. In FIG. 14, it is illustrated that the heat absorption coefficient is −20, but this is simply an example, and the value changes according to the electronic device D or the like.

The switching controller 73' uses the value of the nonlinear term $u_{nl}$ of the sliding mode controller as a switching signal in the same way as the switching controller 73 of the first embodiment. Further, the switching controller 73' determines whether the output of the sliding mode controller 71 will be used as it is or the second operation amount will be used, based on the value of the nonlinear term $u_{nl}$. The switching controller 73' uses a value obtained by adding the sliding mode output and the output of the cooling mode controller 72 by an adder 77, as a second operation amount. That is, the second operation amount is the value obtained by adding the output from the sliding mode controller 71 to the LEDs 41 that are heating sources, and the output of the high-speed valve that is a cooling source of the cooling mode controller 72.

Using the output (control input) of the sliding mode controller 71 as it is means that the output of the sliding mode controller 71 is output to the LEDs 41 that are the heating sources as the first operation amount.

In detail, when the value of the nonlinear term $u_{nl}$ is positive (one side of the switching hyperplane: region I of FIG. 7), the switching controller 73' outputs the output of the sliding mode controller 71 to the LEDs 41 as the first operation amount. Further, when the value of the nonlinear term $u_{nl}$ is negative (the other side of the switching hyperplane: region II of FIG. 7), a sum of the output of the sliding mode controller 71 and the output (the opening/closing signal of the high-speed valve) of the high-speed valve that is a cooling source of the cooling mode controller 72 is used as the second operation amount.

In the cooling mode controller 72, as described above, the high-speed valve 54 that operates at a high speed with the opening/closing time of 0.1 sec or less is opened and closed following high-speed switching by the nonlinear term $u_{nl}$. Accordingly, because the electronic device D may be cooled more greatly than the case in which the LEDs 41 are off, the temperature controllability of the electronic device D when there is a very high heat emission disturbance is secured. Further, because the output of the sliding mode controller 71 is added to the output of the high-speed valve of the cooling mode controller 72 is added as the second operation amount, the excessive response of rapid cooling may be alleviated and an excellent controllability may be obtained.

In the present embodiment, the inspection of the electronic device D is initiated similarly to the first embodiment. Further, during the inspection, the temperature of the electronic device D is measured based on the information of the potential difference generated in the potential difference generating circuit of the electronic device D that is an inspection target, and a temperature control of the electronic device D is performed by the temperature control device 20 while the measurement temperature is taken as a target temperature.

At this time, the temperature control is performed by the temperature controller 30' while the refrigerant is made to flow to the refrigerant flow passage 32a at a constant flow rate by the variable flow rate valve 53 of the cooling mechanism 50 to absorb heat. The temperature controller 30' determines whether the switching controller 73' will use the output of the sliding mode controller 71 as it is or it will use the second operation amount obtained by adding the sliding mode output and the output of the cooling mode controller 72, based on using the value of the nonlinear term $u_{nl}$. In detail, when the value of the nonlinear term $u_{nl}$ of the sliding mode control is positive, the output of the sliding mode controller 71 is output to the LEDs 41 as it is as a first operation amount. Meanwhile, when the nonlinear term $u_{nl}$ is negative, the sum of the output of the sliding mode controller 71 and the output of the high-speed valve that is a cooling source of the cooling mode controller 72 is output as the second operation amount.

In the first embodiment, in the cooling mode controller 72, the high-speed valve 54 that operates at a high speed with the opening/closing time of 0.1 sec or less is opened and closed following high-speed switching by the nonlinear term $u_{nl}$. Accordingly, because the electronic device D can be cooled more greatly than the case in which the LEDs 41 are off, the temperature controllability of the electronic device D when there is a very high heat emission disturbance is secured.

However, in the first embodiment, although the controllability is excellent, there may be an excessive response of rapid cooling since only the high-speed valve 54 operates when the nonlinear term $u_{nl}$ is negative. That is, the output of the LEDs 41 needs to be made higher to compensate for the lowering of the temperature of the electronic device D when the high-speed valve 54 is opened by the switching controller 73, and the timing (the timing for opening the high-speed valve) for performing next cooling also becomes faster. Accordingly, during a control by the switching controller 73, the opening frequency of the high-speed valve 54 also tends to become higher while the amplitude of the current value becomes larger.

In contrast, in the present embodiment, as the second operation amount when the nonlinear term $u_{nl}$ is negative, the output of the sliding mode controller 71 and the output of the high-speed valve of the cooling mode controller 72 are added. In this way, because a control signal is also concurrently sent to the LEDs 41 during the operation of the high-speed valve 54, the excessive response of rapid cooling may be alleviated. Accordingly, in addition to the basic effects of the first embodiment, the amplitude of the current value can be small, the opening frequency of the high-speed valve 54 can be low, and a smooth temperature control with a smaller amplitude may become possible.

Further, in the second embodiment, because the basic configuration of the inspection apparatus is the same as that of the first embodiment, the other effects obtained in the first embodiment also may be obtained in the second embodiment.

<Simulation Result>

Next, the simulation result will be described.

Here, the temperature controllability of the cases in which heat emission disturbances of 150 W, 300 W, and 450 W influence an electronic device (chip) having the size of 30 mm×40 mm, which is formed in the wafer, was simulated.

Figure 15:
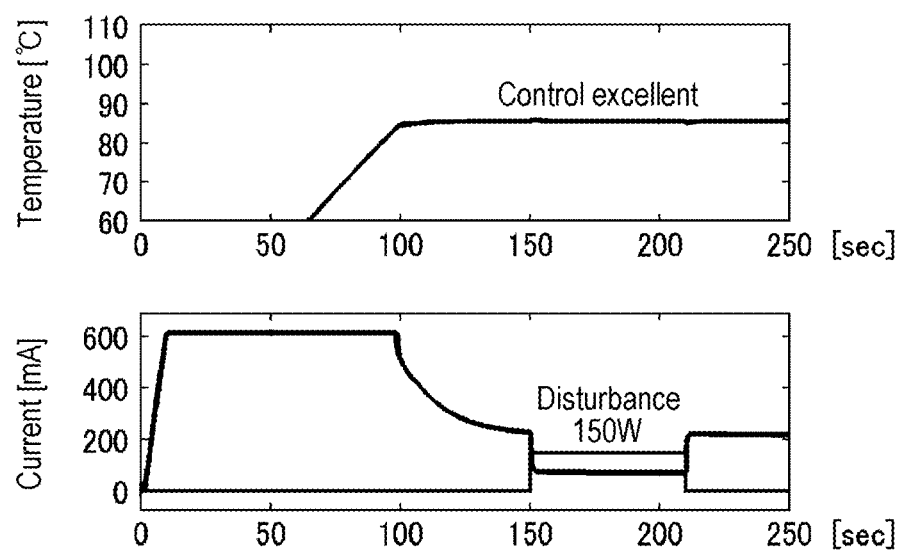
FIG. 15 is a view illustrating a simulation result when a heating disturbance is 150 W in the case in which a temperature control of a chip is performed by a sliding mode control.
Figure 16:
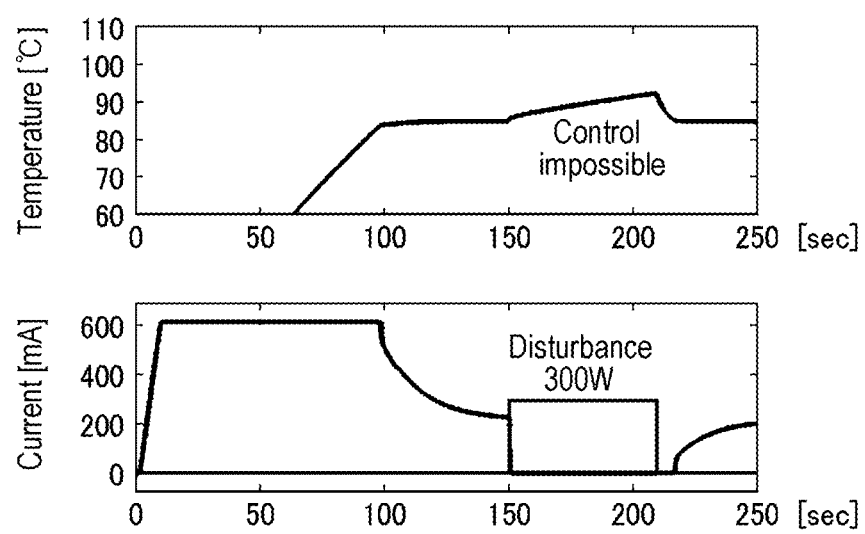
FIG. 16 is a view illustrating a simulation result when a heating disturbance is 300 W in the case in which a temperature control of a chip is performed by a sliding mode control.
Figure 17:
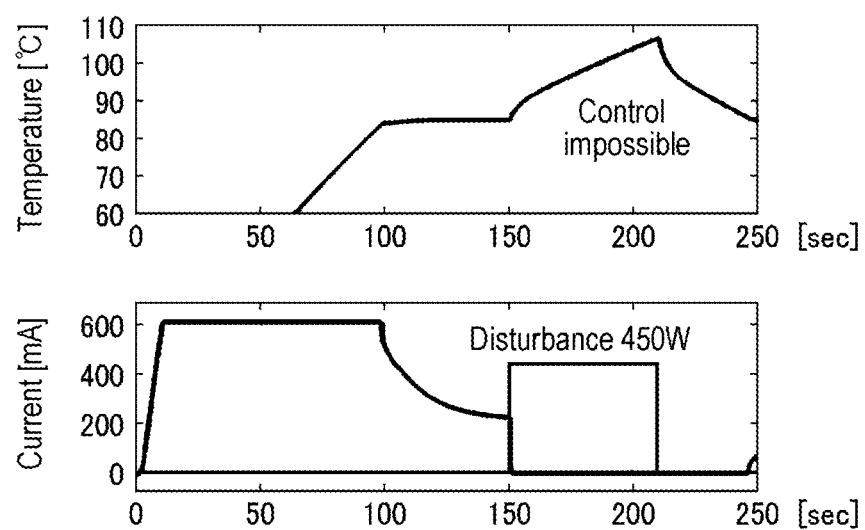
FIG. 17 is a view illustrating a simulation result when a heating disturbance is 450 W in the case in which a temperature control of a chip is performed by a sliding mode control.

FIGS. 15 to 17 are views illustrating simulation results when the temperature control of chips is performed through the sliding mode control in which power supplied to the LEDs is taken as an operation amount while the refrigerant is supplied at a constant flow rate.

It was identified that although an excellent controllability may be maintained at a heat emission disturbance of 150 W in the sliding mode control as illustrated in FIG. 15, temperature rises and the temperature control becomes impossible when the heat emission disturbances are 300 W and 450 W as illustrated in FIGS. 16 and 17.

Figure 18:
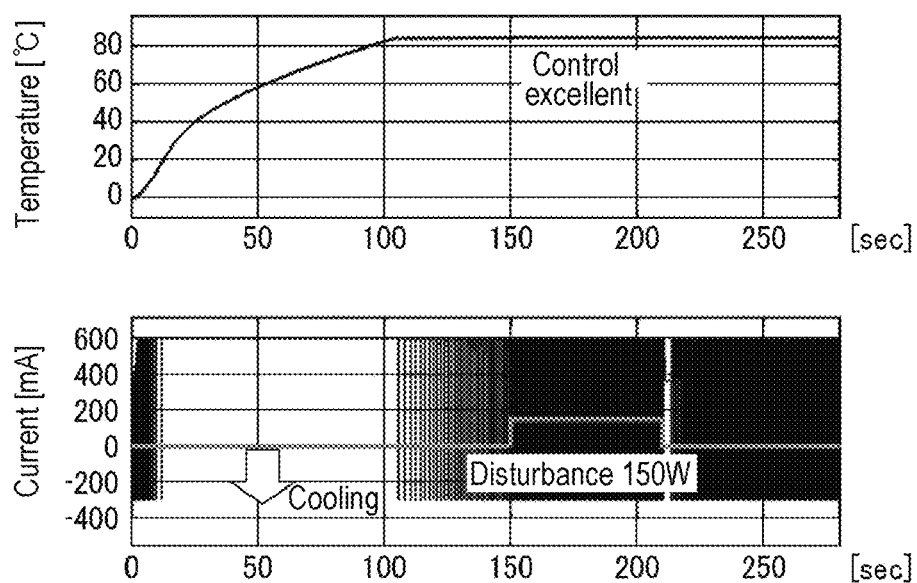
FIG. 18 is a view illustrating a simulation result when a heating disturbance is 150 W in the case in which a temperature control of a chip is performed by the control of the first embodiment.
Figure 19:
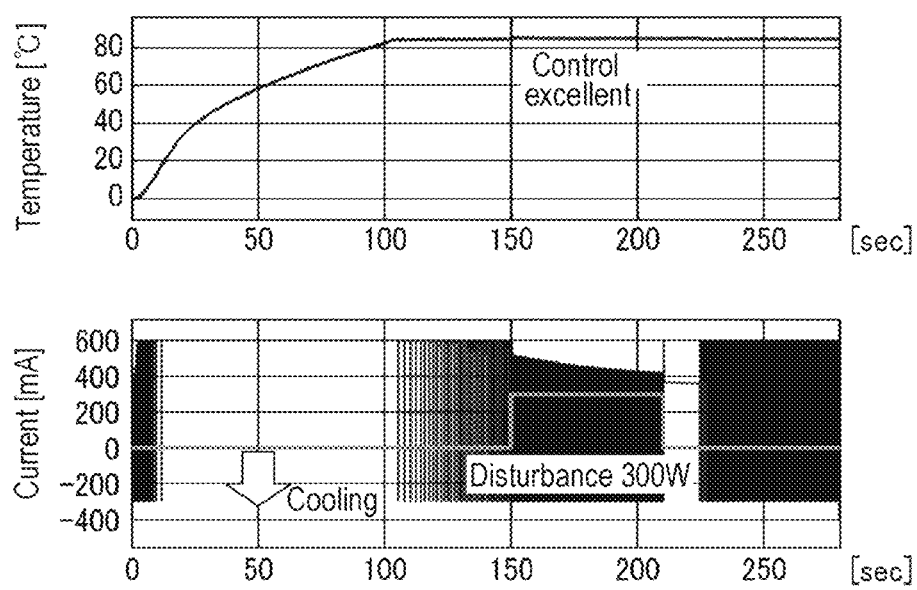
FIG. 19 is a view illustrating a simulation result when a heating disturbance is 300 W in the case in which a temperature control of a chip is performed by the control of the first embodiment.

FIGS. 18 to 20 are views illustrating a simulation result of the first embodiment in which both the sliding mode control in which power supplied to the LEDs is taken as an operation amount and the cooling mode control through opening and closing of the high-speed valve performed when the nonlinear term $u_{nl}$ is negative are used.

As illustrated in the drawings, it was identified that temperature may be excellently controlled in all the cases in which the heat emission disturbances of 150 W to 450 W are exerted, by the first embodiment in which both the sliding mode control and the cooling mode control through opening and closing of the high-speed valve are used.

Figure 22:
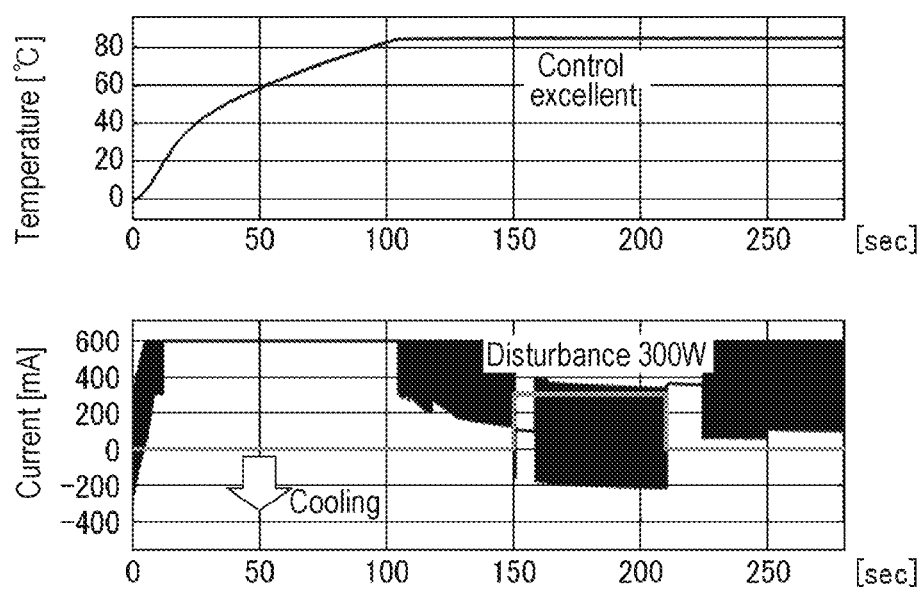
FIG. 22 is a view illustrating a simulation result when a heating disturbance is 300 W in the case in which a temperature control of a chip is performed by the control of the second embodiment.
Figure 23:
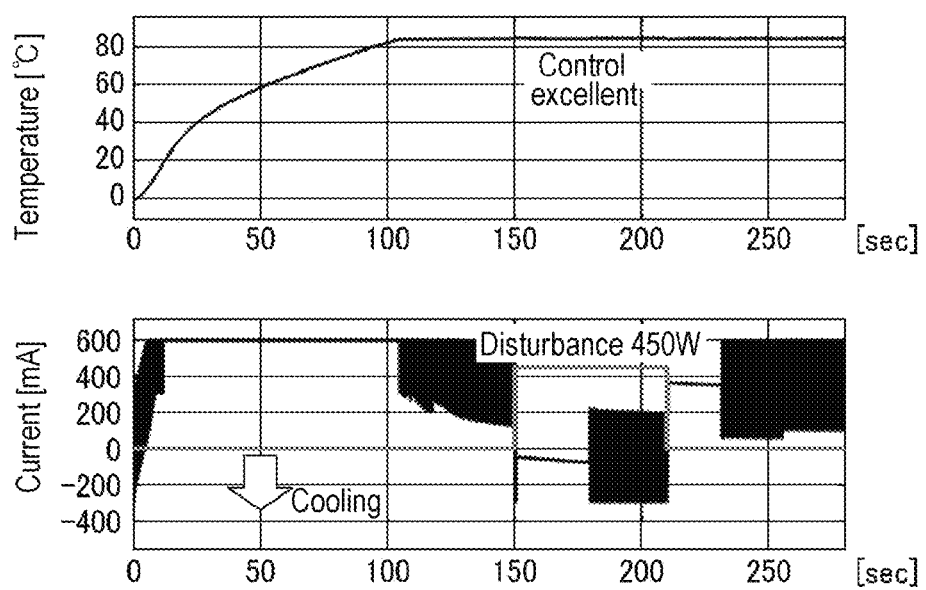
FIG. 23 is a view illustrating a simulation result when a heating disturbance is 450 W in the case in which a temperature control of a chip is performed by the control of the second embodiment.

FIGS. 21 to 23 are views illustrating a simulation result of the second embodiment in which both the sliding mode control and the control in which the output of the sliding mode controller and the output of the cooling mode controller are added are used.

As illustrated in the drawings, it was identified that temperature may be excellently controlled in all the cases in which the heat emission disturbances of 150 W to 450 W are exerted by the second embodiment in which both the sliding mode control and the control in which the output of the sliding mode controller and the output of the cooling mode controller are added are used. Further, it can be seen that the amplitude of the current supplied when the heat emission disturbance is generated is smaller in the second embodiment than in the first embodiment.

Figure 24:
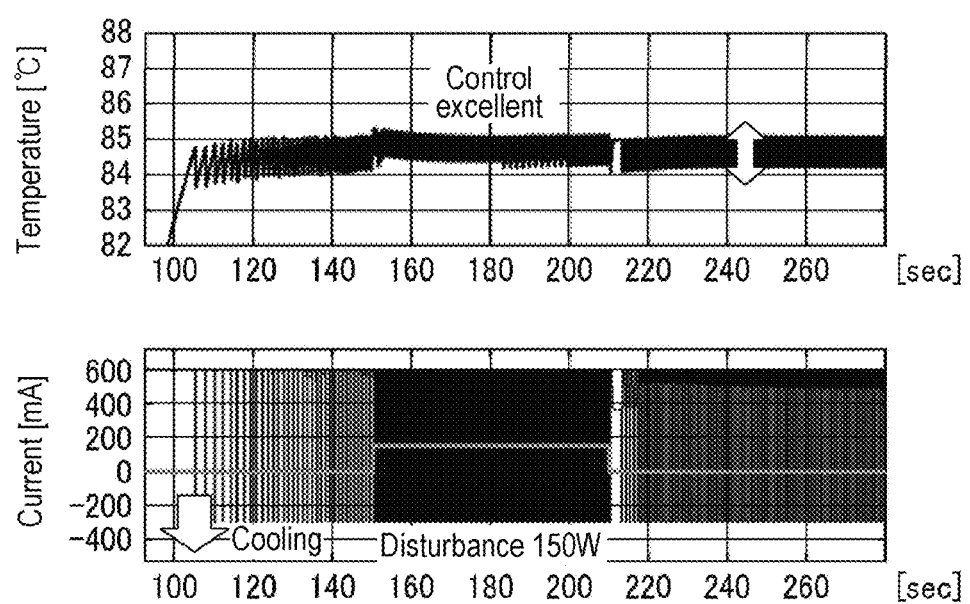
FIG. 24 is an enlarged view illustrating a simulation result of the first embodiment when a heating disturbance is 150 W.
Figure 25:
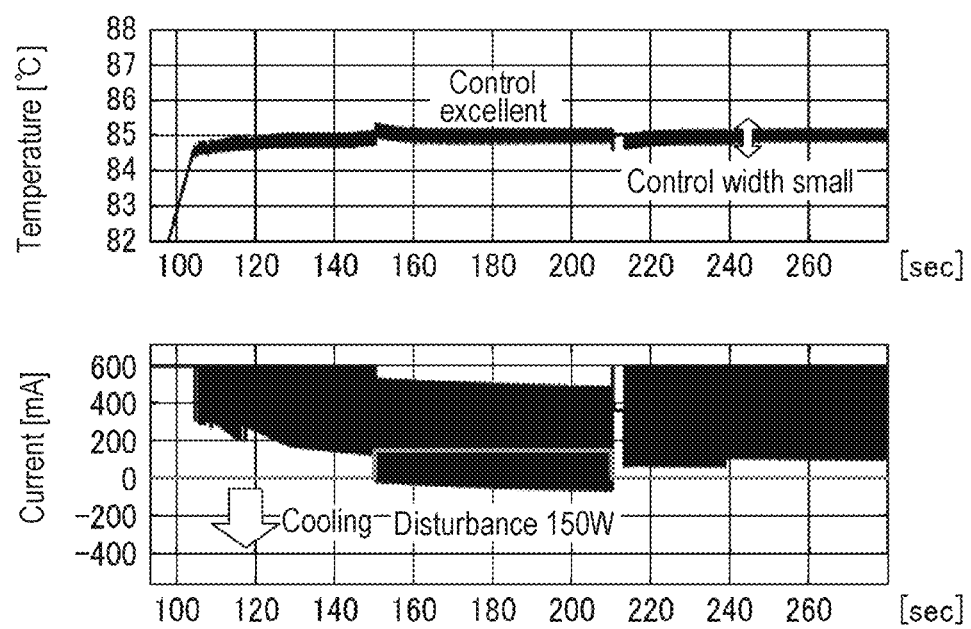
FIG. 25 is an enlarged view illustrating a simulation result of the second embodiment when a heating disturbance is 150 W.

FIGS. 24 and 25 are enlarged views illustrating the simulation results of the first embodiment and the second embodiment when the heat emission disturbance is 150 W. It can be seen from the drawings that the fluctuation width of the current output is smaller and the control amplitude is smaller in the second embodiment than in the first embodiment. Further, it can be seen that the overshoot and undershoot of the temperature to be controlled at a timing in which the heat emission disturbance is rapidly changed are also smaller in the second embodiment.

Figure 26:
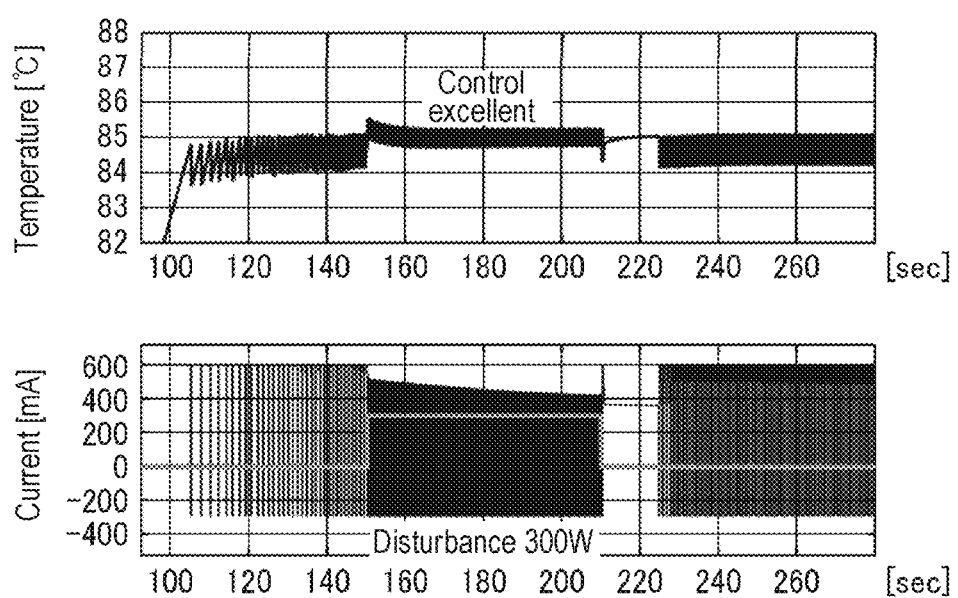
FIG. 26 is an enlarged view illustrating a simulation result of the first embodiment when a heating disturbance is 300 W.
Figure 27:
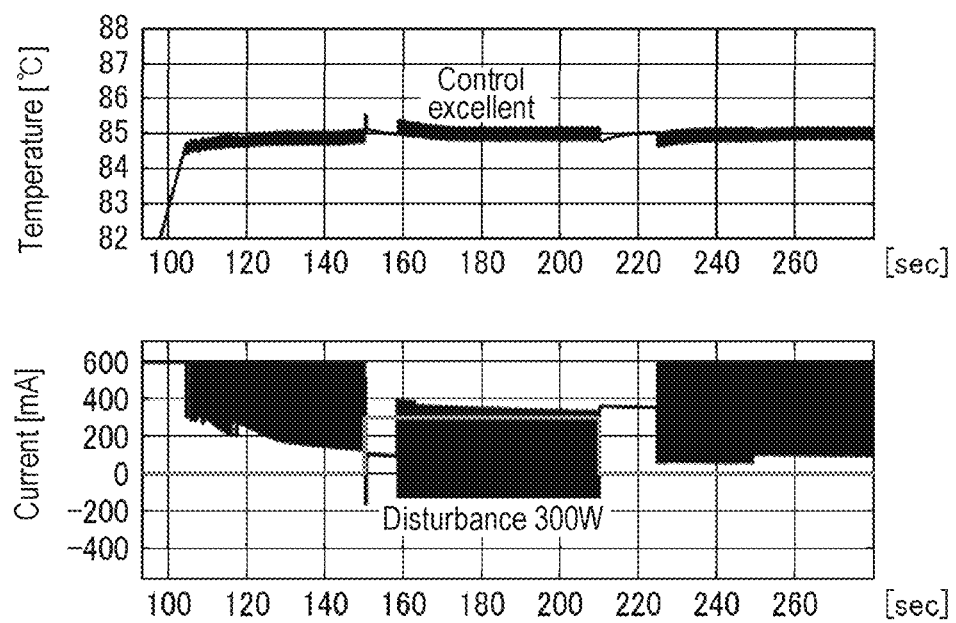
FIG. 27 is an enlarged view illustrating a simulation result of the second embodiment when a heating disturbance is 300 W.
Figure 28:
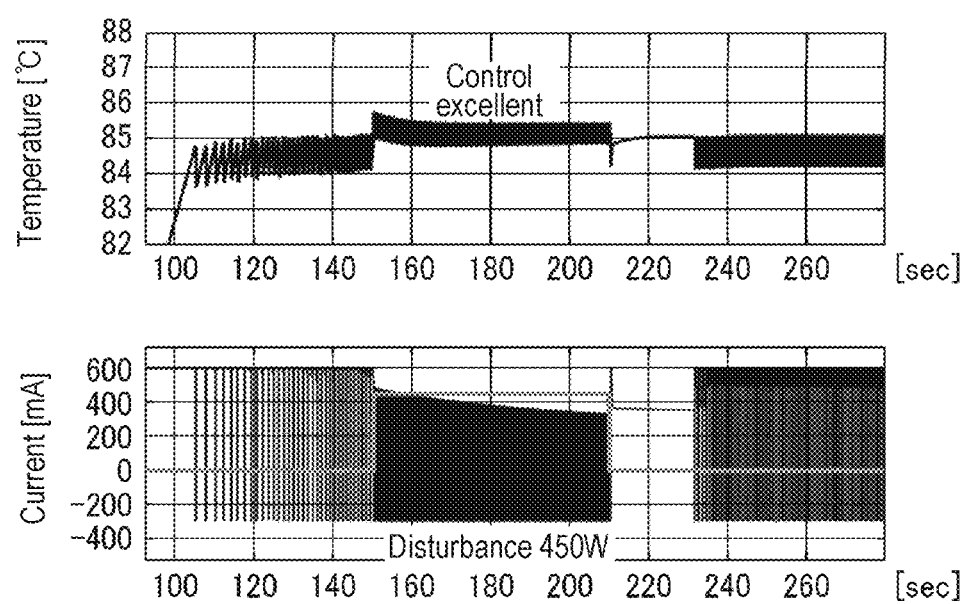
FIG. 28 is an enlarged view illustrating a simulation result of the first embodiment when a heating disturbance is 450 W.
Figure 29:
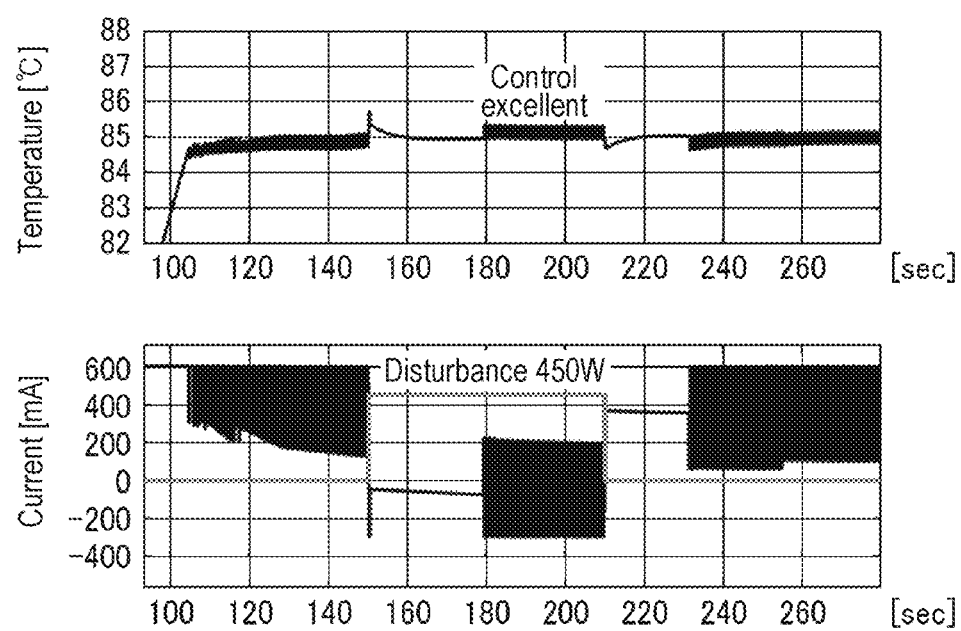
FIG. 29 is an enlarged view illustrating a simulation result of the second embodiment when a heating disturbance is 450 W.

FIGS. 26 and 27 are enlarged views illustrating the simulation results of the first embodiment and the second embodiment when the heat emission disturbance is 300 W. FIGS. 28 and 29 are enlarged views illustrating the simulation results of the first embodiment and the second embodiment when the heat emission disturbance is 450 W. As can be understood clearly from the drawings, it can be seen that the fluctuation width of the current output is smaller and the control width is smaller in the second embodiment than in the first embodiment as in the case in which the disturbance is 150 W, even though the disturbance increases to 300 W and 450 W. Further, it can be seen that the overshoot and undershoot of the temperature to be controlled at a timing in which the heat emission disturbance is rapidly changed are also smaller in the second embodiment.

<Other Applications>

For example, although it has been described in the embodiments that the LEDs are used as heat sources, the heat sources are not limited to the LEDs and may be other heat sources such as resistance heaters. Further, although the electronic device (chip) has been illustrated in the embodiments as an example of the temperature control target, the temperature control target may be a stage and is not limited to the electronic device (chip). Further, the present disclosure is not limited to the case in which the temperature control device is applied to the inspection apparatus.

According to the present disclosure, a temperature control device, a temperature control method, and an inspection apparatus, by which the temperature of a temperature control object can be controlled with an excellent controllability even when a disturbance is generated.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature control device for controlling a temperature of a temperature control object, the temperature control device comprising:
   a heater having a heating source configured to heat the temperature control object;
   a cooler having a cooling source configured to cool the temperature control object; and
   a temperature controller configured to control the heating source and the cooling source,
   wherein the temperature controller uses a temperature measurement value of the temperature control object as a control target, and
   wherein the temperature controller comprises:
   a sliding mode controller configured to supply power to the heating source as an operation amount;
   a cooling mode controller configured to supply power to the cooling source as an operation amount; and
   a switching controller configured to determine whether an output of the sliding mode controller will be output to the heating source as a first operation amount, or an output of the cooling mode controller will be used as a second operation amount, based on a value of a nonlinear term of the output of the sliding mode controller,
   wherein the switching controller performs switching such that only the output of the sliding mode controller is used when the nonlinear term is in a region of one side of a switching hyperplane in a sliding mode control, and the output of the cooling mode controller is used when the nonlinear term is in a region of the other side of the switching hyperplane, and
   wherein the region of the one side has a positive value of the nonlinear term, and the region of the other side has a negative value of the nonlinear term.

2. The temperature control device of claim 1, wherein the heating source is an LED, and the first operation amount is a current value supplied to the LED.

3. The temperature control device of claim 1, wherein the cooler cools the temperature control object with a refrigerant, the cooling source is a high-speed valve configured to open and close a passage of the refrigerant, and the output of the cooling mode controller is an opening/closing signal to the high-speed valve.

4. The temperature control device of claim 1, wherein the cooler performs heat absorption of the temperature control object by supplying a refrigerant at a constant flow rate by the cooling mode controller and separately supplying the power to the cooling source.

5. The temperature control device of claim 1, wherein the temperature control object is an electronic device provided in a substrate.

6. A temperature control device for controlling a temperature of a temperature control object, the temperature control device comprising:
   a heater having a heating source configured to heat the temperature control object;
   a cooler having a cooling source configured to cool the temperature control object; and
   a temperature controller configured to control the heating source and the cooling source,
   wherein the temperature controller uses a temperature measurement value of the temperature control object as a control target, and
   wherein the temperature controller comprises:
   a sliding mode controller configured to supply power to the heating source as an operation amount;
   a cooling mode controller configured to supply power to the cooling source as an operation amount; and
   a switching controller configured to determine whether an output of the sliding mode controller will be output to the heating source as a first operation amount, or a sum of the output of the sliding mode controller and an output of the cooling mode controller will be used as a second operation amount, based on a value of a nonlinear term of the output of the sliding mode controller,
   wherein the switching controller performs switching such that only the output of the sliding mode controller is used when the nonlinear term is in a region of one side of a switching hyperplane in a sliding mode control, and the output of the cooling mode controller is used when the nonlinear term is in a region of the other side of the switching hyperplane, and
   wherein the region of the one side has a positive value of the nonlinear term, and the region of the other side has a negative value of the nonlinear term.

7. A temperature control method for controlling a temperature of a temperature control object, the method using a temperature measurement value of the temperature control object as a control target, the temperature control method comprising:
   performing a sliding mode control by supplying power to a heating source configured to heat the temperature control object as an operation amount;
   performing a cooling mode control by supplying power to a cooling source configured to cool the temperature control object as an operation amount; and
   determining whether an output of the sliding mode control will be output to the heating source as a first operation amount, or an output of the cooling mode control will be used as a second operation amount, based on value of a nonlinear term of the output of the sliding mode control,
   wherein, in the determining, switching is performed such that only the output of the sliding mode control is used when the nonlinear term is in a region of one side of a switching hyperplane in a sliding mode control, and the output of the cooling mode control is used when the nonlinear term is in a region of the other side of the switching hyperplane, and
   wherein the region of the one side has a positive value of the nonlinear term, and the region of the other side has a negative value of the nonlinear term.

8. The temperature control method of claim 7, wherein the heating source is an LED, and the first operation amount is a current value applied to the LED.

9. The temperature control method of claim 7, wherein the cooling source is a high-speed valve configured to open and close a passage of a refrigerant which cools the temperature control object, and the operation amount of the cooling mode control is an opening/closing signal to the high-speed valve.

10. The temperature control method of claim 7, wherein heat absorption of the temperature control object is performed by supplying a refrigerant at a constant flow rate and separately supplying the operation amount of the cooling mode control.

11. The temperature control method of claim 7, wherein the temperature control object is an electronic device provided in a substrate.

12. A temperature control method for controlling a temperature of a temperature control object, the method using a temperature measurement value of the temperature control object as a control target, the temperature control method comprising:

performing a sliding mode control by supplying power to a heating source configured to heat the temperature control object as an operation amount;

performing a cooling mode control by supplying power to a cooling source configured to cool the temperature control object as an operation amount; and determining whether an output of the sliding mode control will be output to the heating source as a first operation amount, or a sum of the output of the sliding mode control and an output of the cooling mode control will be used as a second operation amount, based on value of a nonlinear term of the output of the sliding mode control, wherein, in the determining, switching is performed such that only the output of the sliding mode control is used when the nonlinear term is in a region of one side of a switching hyperplane in a sliding mode control, and the output of the cooling mode control is used when the nonlinear term is in a region of the other side of the switching hyperplane, and wherein the region of the one side has a positive value of the nonlinear term, and the region of the other side has a negative value of the nonlinear term.

13. An inspection apparatus comprising:

a stage on which a substrate provided with an electronic device is placed;

an inspection mechanism configured to bring a probe into an electrical contact with the electronic device provided in the substrate on the stage and inspect the electronic device;

a temperature measuring part configured to measure a temperature of the electronic device; and a temperature control device configured to control a temperature of the electronic device, wherein the temperature control device comprises:

a heater having a heating source configured to heat the electronic device;

a cooler having a cooling source configured to cool the electronic device; and a temperature controller configured to control the heating source and the cooling source, wherein the temperature controller uses a temperature measurement value of the electronic device as a control target, and wherein the temperature controller comprises:

a sliding mode controller configured to supply power to the heating source as an operation amount;

a cooling mode controller configured to supply power to the cooling source as an operation amount; and a switching controller configured to determine whether an output of the sliding mode controller will be output to the heating source as a first operation amount, or an output of the cooling mode controller will be used as a second operation amount, based on a value of a nonlinear term of the output of the sliding mode controller, wherein the switching controller performs switching such that only the output of the sliding mode controller is used when the nonlinear term is in a region of one side of a switching hyperplane in a sliding mode control, and the output of the cooling mode controller is used when the nonlinear term is in a region of the other side of the switching hyperplane, and wherein the region of the one side has a positive value of the nonlinear term, and the region of the other side has a negative value of the nonlinear term.

14. An inspection apparatus comprising:

a stage on which a substrate provided with an electronic device is placed;

an inspection mechanism configured to bring a probe into an electrical contact with the electronic device provided in the substrate on the stage and inspect the electronic device;

a temperature measuring part configured to measure a temperature of the electronic device; and a temperature control device configured to control a temperature of the electronic device, wherein the temperature control device comprises:

a heater having a heating source configured to heat the electronic device;

a cooler having a cooling source configured to cool the electronic device; and a temperature controller configured to control the heating source and the cooling source, wherein the temperature controller uses a temperature measurement value of the electronic device as a control target, and wherein the temperature controller comprises:

a sliding mode controller configured to supply power to the heating source as an operation amount;

a cooling mode controller configured to supply power to the cooling source as an operation amount; and a switching controller configured to determine whether an output of the sliding mode controller will be output to the heating source as a first operation amount, or a sum of the output of the sliding mode controller and an output of the cooling mode controller will be used as a second operation amount, based on a value of a nonlinear term of the output of the sliding mode controller, wherein the switching controller performs switching such that only the output of the sliding mode controller is used when the nonlinear term is in a region of one side of a switching hyperplane in a sliding mode control, and the output of the cooling mode controller is used when the nonlinear term is in a region of the other side of the switching hyperplane, and wherein the region of the one side has a positive value of the nonlinear term, and the region of the other side has a negative value of the nonlinear term.

15. An inspection apparatus comprising:

a stage on which a substrate provided with an electronic device is placed;

an inspection mechanism configured to bring a probe into an electrical contact with the electronic device provided in the substrate on the stage and inspect the electronic device;

a temperature measuring part configured to measure a temperature of the electronic device; and a temperature control device configured to control a temperature of the electronic device, wherein the temperature control device comprises:

a heater having a heating source configured to heat the electronic device;

a cooler having a cooling source configured to cool the electronic device; and a temperature controller configured to control the heating source and the cooling source, and wherein the cooler comprises:

a refrigerant source configured to supply a refrigerant as the cooling source;

a first refrigerant pipeline connected to the refrigerant source and the stage and configured to supply the refrigerant from the refrigerant source to the stage at a constant flow rate;

a second refrigerant pipeline provided parallel to the first refrigerant pipeline and configured to supply the refrigerant from the refrigerant source to the stage; and a high-speed valve provided in the second refrigerant pipeline and configured to supply the refrigerant to the stage or stop the supply of the refrigerant.

* * * * *